United States Patent
Okamoto et al.

(10) Patent No.: US 9,741,477 B2
(45) Date of Patent: Aug. 22, 2017

(54) SINTERED BODY FOR VARISTOR, MULTILAYER SUBSTRATE USING SAME, AND PRODUCTION METHOD FOR THESE

(71) Applicant: HITACHI METALS, LTD., Tokyo (JP)

(72) Inventors: Naoyuki Okamoto, Mishima-gun (JP); Hiroyuki Ito, Mishima-gun (JP); Toshiki Kida, Mishima-gun (JP)

(73) Assignee: HITACHI METALS, LTD., Tokyo (JP)

( * ) Notice: Subject to any disclaimer, the term of this patent is extended or adjusted under 35 U.S.C. 154(b) by 0 days.

(21) Appl. No.: 15/101,650

(22) PCT Filed: Dec. 5, 2014

(86) PCT No.: PCT/JP2014/082250
§ 371 (c)(1),
(2) Date: Jun. 3, 2016

(87) PCT Pub. No.: WO2015/083822
PCT Pub. Date: Jun. 11, 2015

(65) Prior Publication Data
US 2016/0379738 A1    Dec. 29, 2016

(30) Foreign Application Priority Data

Dec. 6, 2013    (JP) .................................. 2013-253230
Apr. 11, 2014    (JP) .................................. 2014-082000

(51) Int. Cl.
*H05K 1/03*    (2006.01)
*H01C 7/112*    (2006.01)
(Continued)

(52) U.S. Cl.
CPC .............. *H01C 7/112* (2013.01); *B32B 18/00* (2013.01); *C04B 35/453* (2013.01); *C04B 35/64* (2013.01);
(Continued)

(58) Field of Classification Search
CPC .................................................. H05K 1/0306
See application file for complete search history.

(56) References Cited

U.S. PATENT DOCUMENTS 5,338,334 A * 8/1994 Zhen ........................ B01J 23/75
501/84
2009/0243768 A1    10/2009 Sato et al.
(Continued)

FOREIGN PATENT DOCUMENTS

JP    07-211518 A    8/1995
JP    09-312203 A    12/1997
(Continued)

OTHER PUBLICATIONS

International Search Report for PCT/JP2014/082250 dated Feb. 24, 2015 [PCT/ISA/210].
(Continued)

*Primary Examiner* — Jeremy C Norris
(74) *Attorney, Agent, or Firm* — Sughrue Mion, PLLC

(57) ABSTRACT

To provide a zinc oxide-based varistor that exhibits adequate characteristics without using antimony. Disclosed is a sintered body for a varistor, including zinc oxide as a main component; 0.6 to 3.0 mol % of bismuth oxide in terms of bismuth (Bi); 0.2 to 1.4 mol % of cobalt oxide in terms of cobalt (Co); 0.1 to 1.5 mol % of chrome oxide in terms of chrome (Cr); and 0.1 to 1.5 mol % of manganese oxide in terms of manganese (Mn), wherein the contents of antimony (Sb), a rare earth element and tin (Sn) are not more than a level of impurities.

13 Claims, 15 Drawing Sheets

(51) Int. Cl.
*H01C 17/065* (2006.01)
*H01C 17/30* (2006.01)
*B32B 18/00* (2006.01)
*C04B 35/453* (2006.01)
*H05K 1/02* (2006.01)
*C04B 35/64* (2006.01)
*H01C 1/14* (2006.01)

(52) U.S. Cl.
CPC ......... *H01C 1/14* (2013.01); *H01C 17/06546* (2013.01); *H01C 17/30* (2013.01); *H05K 1/0254* (2013.01); *B32B 2307/206* (2013.01); *B32B 2457/00* (2013.01); *C04B 2235/3215* (2013.01); *C04B 2235/3224* (2013.01); *C04B 2235/3241* (2013.01); *C04B 2235/3262* (2013.01); *C04B 2235/3263* (2013.01); *C04B 2235/3275* (2013.01); *C04B 2235/3277* (2013.01); *C04B 2235/3284* (2013.01); *C04B 2235/3298* (2013.01); *C04B 2235/3409* (2013.01); *C04B 2235/656* (2013.01); *C04B 2235/72* (2013.01); *C04B 2237/34* (2013.01); *C04B 2237/62* (2013.01); *H05K 2201/0738* (2013.01)

(56) References Cited

U.S. PATENT DOCUMENTS

2011/0038088 A1    2/2011  Noma et al.
2012/0135563 A1    5/2012  Lien et al.

FOREIGN PATENT DOCUMENTS

| | | |
|---|---|---|
| JP | 10-032104 A | 2/1998 |
| JP | 11-097217 A | 4/1999 |
| JP | 2000-243608 A | 9/2000 |
| JP | 2001-093705 A | 4/2001 |
| JP | 2003-109806 A | 4/2003 |
| JP | 2003-335578 A | 11/2003 |
| JP | 2005-097070 A | 4/2005 |
| JP | 2007-005499 A | 1/2007 |
| JP | 2008-100856 A | 5/2008 |
| JP | 2009-239231 A | 10/2009 |
| JP | 2010-238882 A | 10/2010 |
| JP | 2012-114443 A | 6/2012 |
| WO | 2009/136535 A1 | 11/2009 |

OTHER PUBLICATIONS

English translation of International Preliminary Report on Patentability for International Application No. PCT/JP2014/082250 issued Jun. 7, 2016, 6 pages.

\* cited by examiner (a)

(b)

(c)

(a)

(b)

(c)

(d)

(a)

(b)

(c)

(d)

(e)

(f)

i)

ii)

(g)

(h)

i)

ii)

(a)

(b)

(c)

(d)

(e)

i)

ii)

(f)

(g)

i)

ii)

(a)

(b)

(c)

(d)

(a)

(b)

US 9,741,477 B2

SINTERED BODY FOR VARISTOR, MULTILAYER SUBSTRATE USING SAME, AND PRODUCTION METHOD FOR THESE

CROSS REFERENCE TO RELATED APPLICATIONS

This application is a National Stage of International Application No. PCT/JP2014/082250 filed Dec. 5, 2014 (claiming priority based on Japanese Patent Application No. 2013-253230 filed Dec. 6, 2013 and Japanese Patent Application No. 2014-082000 filed Apr. 11, 2014), the contents of which are incorporated herein by reference in their entirety.

TECHNICAL FIELD

The present invention relates to a sintered body for a zinc oxide-based varistor, a multilayer substrate using the sintered body for a zinc oxide-based varistor, a method for producing a sintered body for a zinc oxide-based varistor, and a method for producing a multilayer substrate using the sintered body for a zinc oxide-based varistor.

BACKGROUND ART

Varistor elements are assembled in electronic devices, such as computers and cellular phones, to protect electronic circuits and elements included in them against abnormally high voltages created by static electricity, noise, and the like.

Such varistor elements utilize varistors (varistor material) that exhibit a high electrical resistance at a low applied voltage, allowing the flow of only slight current, while exhibiting a drastically reduced electrical resistance at a high applied voltage to allow for the flow of a large amount of current. Thus, the varistors have a nonlinear resistance. Among these varistors, a zinc oxide-based varistor (zinc oxide-based varistor material) is frequently used because it can easily achieve the desired characteristics. The zinc oxide-based varistor contains zinc oxide as a main component along with other oxides added thereto.

Such a varistor element, which uses the zinc oxide-based varistor material, specially, the sintered body for the zinc oxide-based varistor produced by sintering this material, is assembled and incorporated in an electronic circuit. For this reason, even though current flows through part of the electronic circuit due to excessive voltage caused by static electricity, noise, or the like, the varistor element can suppress the flow of a large amount of current through a target part of the electronic circuit as well as a target element therein.

On the other hand, a space occupied by the varistor element could be an obstacle for the miniaturization of electronic devices.

For example, one means of solving this problem is seen in Patent Document 1. which describes how an electrostatic discharge (ESD) protection device, such as the varistor element, can be integrally formed as a low-temperature co-fired ceramic (LTCC) with the electrodes in a multilayer substrate.

The electrodes in contact with the LTCC are desirably made using silver (Ag) with a low electrical resistance. However, when heated to a high temperature, for example, 1,000° C. or higher, silver could degrade in performance as the electrode due to its oxidization and the like.

For this reason, Patent Documents 2 to 6 describe a method for forming a multilayer substrate with the varistor element (ESD protection device) that involves firing a laminated body including mixed-raw-material sheets (green sheets) of varistor material or the like with electrode material of silver formed at the surface of each sheet at a temperature ranging approximately from 850° C. to 950°.

Patent Document 1: WO 2009/136535 A
Patent Document 2: JP 2010-238882 A
Patent Document 3: JP 2007-5499 A
Patent Document 4: JP 9-312203 A
Patent Document 5: JP 2012-114443 A
Patent Document 6: JP 2005-97070 A

SUMMARY OF INVENTION

Problems to be Solved by the Invention

Most conventional varistor materials (sintered bodies for varistors) use antimony (Sb) and rare earth elements, such as yttrium (Y) or praseodymium (Pr), as additives to attain predetermined varistor characteristics like nonlinear resistance. However, antimony (Sb) is a toxic element. Rare earth elements are only produced in certain areas. There are concerns about securing a stable supply of the rare earth elements over a long period of time, and their prices are very high and vary widely. This leads to the need for a sintered body for a zinc oxide-based varistor exhibiting adequate characteristics without requiring the use of antimony (Sb) and rare earth elements, as well as a multilayer substrate using the sintered body.

Methods for producing a sintered body for varistors are also required to meet the following conditions.

As mentioned above, a sintered body for a varistor (hereinafter simply referred to as a "sintered body" in some cases) is known to be produced by firing at a firing temperature of approximately 850° C. to 950° C., which is lower than 1,000° C. However, these conventional methods require that a heat treatment be previously conducted to diffuse the components of raw materials before firing at a temperature ranging approximately from 850° C. to 950° C. to uniformize the composition of the sintered body produced after the firing. The heat treatment involves heating, at 300° C. or higher, a mixture of two or more kinds of raw materials, such as oxides, which are used to form a sintered body for a varistor with a desired composition.

A sintered body is obtained by firing at a temperature of approximately 850° C. to 950° C. using the raw materials mixed and subjected to the heat treatment and, if needed, other raw materials.

The two heating steps of the heat treatment and the firing process lead not only to complicated processes but also to an increase in energy consumption. For this reason, a request has been made to omit the heat treatment step.

Accordingly, it is an object of the present invention to provide a sintered body for a zinc oxide-based varistor that exhibits adequate characteristics without using antimony (Sb) and rare earth elements, and a multilayer substrate using the sintered body.

Further, it is another object of the present invention to provide a method for producing a zinc oxide-based varistor and a method for producing a multilayer substrate including the zinc oxide-based varistor, which can possess the adequate characteristics without using antimony (b) and rare earth elements by firing, at a temperature lower than 1,000° C., a material containing a main component that is easily diffused during firing, even though a heat treatment is not previously conducted.

Means for Solving the Problems

A first aspect of the present invention is directed to a sintered body for a varistor, including: zinc oxide as a main component; 0.6 to 3.0 mol % of bismuth oxide in terms of bismuth (Bi); 0.2 to 1.4 mol % of cobalt oxide in terms of cobalt (Co); 0.1 to 1.5 mol % of chrome oxide in terms of chrome (Cr); and 0.1 to 1.5 mol % of manganese oxide in terms of manganese (Mn), wherein the contents of antimony (Sb), a rare earth element and tin (Sn) not more than a level of impurities.

A second aspect of the present invention is directed to the sintered body for a varistor according to the first aspect, including: 0.6 to 3.0 mol % of bismuth oxide in terms of bismuth (Bi); 0.2 to 1.4 mol % of cobalt oxide in terms of cobalt (Co); 0.1 to 1.5 mol % of chrome oxide in terms of chrome (Cr); and 0.1 to 1.5 mol % of manganese oxide in terms of manganese (Mn), the balance being zinc oxide and inevitable impurities.

A third aspect of the present invention is directed to the sintered body for a varistor according to the first or second aspect, further including at least one selected from the group consisting of 0.1 to 2.0 mol % of scandium oxide in terms of scandium (Sc); 0.1 to 2.0 mol % of barium oxide in terms of barium (Ba); and 0.1 to 4.0 mol % of boron oxide in terms of boron (B).

A fourth aspect of the present invention is directed to the sintered body for a varistor according to the third aspect, further including at least one selected from the group consisting of 0.1 to 2.0 mol % of scandium oxide in terms of scandium (Sc); 0.1 to 2.0 mol % of barium oxide in terms of barium (Ba); and 0.1 to 2.0 mol % of boron oxide in terms of boron (B).

A fifth aspect of the present invention is directed to the sintered body for a varistor according to any one of the first to fourth aspects, including: 0.6 to 2.0 mol % of bismuth oxide in terms of bismuth (Bi); 0.2 to 1.0 mol % of cobalt oxide in terms of cobalt (Co); 0.1 to 1.0 mol % of chrome oxide in terms of chrome (Cr); and 0.1 to 1.0 mol % of manganese oxide in terms of manganese (Mn).

A sixth aspect of the present invention is directed to a multilayer substrate including: a first insulating layer; a varistor layer as the sintered body for a varistor according to any one of the first to fifth aspects; and a second insulating layer in this order, the multilayer substrate further including: a first internal electrode disposed at one main surface of the varistor layer; a second internal electrode disposed at the other main surface of the varistor layer; and a first penetrating electrode that penetrates the first insulating layer and a second penetrating electrode that penetrates the second insulating layer, wherein the first penetrating electrode is electrically connected to the first internal electrode, and the second penetrating electrode is electrically connected to the second internal electrode.

A seventh aspect of the present invention is directed to a multilayer substrate including: a first insulating layer, a second insulating layer, and a third insulating layer, which are laminated in this order, the second insulating layer including therein a varistor layer as the sintered body for a varistor according to any one of the first to fifth aspects; a first internal electrode disposed at one main surface of the varistor layer; a second internal electrode disposed at the other main surface of the varistor layer; and a first penetrating electrode that penetrates the first insulating layer and a second penetrating electrode that penetrates the second insulating layer, wherein the first penetrating electrode is electrically connected to the first internal electrode, and the second penetrating electrode is electrically connected to the second internal electrode.

An eight aspect of the present invention is directed to a multilayer substrate including: a first insulating layer; a varistor layer as the sintered body for a varistor according to any one of the first to fifth aspects; and a second insulating layer in this order, the multilayer substrate further including: a first internal electrode disposed at one main surface of the varistor layer; a second internal electrode disposed at the other main surface of the varistor layer; and first and second penetrating electrodes that penetrate the first insulating layer, the varistor layer and the second insulating layer, wherein the first penetrating electrode is electrically connected to the first internal electrode, and the second penetrating electrode is electrically connected to the second internal electrode.

A ninth aspect of the present invention is directed to a method for producing a sintered body for a varistor, which includes the steps of: 1) preparing a mixed raw material by mixing at least zinc oxide, bismuth oxide, cobalt oxide, chrome oxide, and manganese oxide without applying a heat treatment such that the mixed raw material contains the zinc oxide as a main component, 0.6 to 3.0 mol % of bismuth oxide in terms of bismuth (Bi), 0.2 to 1.4 mol % of cobalt oxide in terms of cobalt (Co), 0.1 to 1.5 mol % of chrome oxide in terms of chrome (Cr) and 0.1 to 1.5 mol % of manganese oxide in terms of manganese (Mn), wherein the contents of antimony (Sb), rare earth element and tin (Sn) are not more than a level of impurities; and 2) firing the mixed raw material at a temperature of 850° C. to 950° C.

A tenth aspect of the present invention is directed to the method for producing a sintered body for a varistor according to the ninth aspect, wherein the mixed raw material further includes at least one selected from the group consisting of 0.1 to 2.0 mol % of scandium oxide in terms of scandium (Sc); 0.1 to 2.0 mol % of barium oxide in terms of barium (Ba); and 0.1 to 4.0 mol % of boron oxide in terms of boron (B).

An eleventh aspect of the present invention is directed to a method for producing a multilayer substrate, which includes the steps of: 1) preparing a mixed raw material by mixing at least zinc oxide, bismuth oxide, cobalt oxide, chrome oxide and manganese oxide without applying a heat treatment such that the mixed raw material contains the zinc oxide as a main component, 0.6 to 3.0 mol % of bismuth oxide in terms of bismuth (Bi), 0.2 to 1.4 mol % of cobalt oxide in terms of cobalt (Co), 0.1 to 1.5 mol % of chrome oxide in terms of chrome (Cr) and 0.1 to 1.5 mol % of manganese oxide in terms of manganese (Mn), wherein the contents of antimony (Sb), rare earth element and tin (Sn) are not more than a level of impurities; 2) disposing a first electrode material on a first insulating sheet made of insulating material; 3) forming a mixed-raw-material sheet containing the mixed raw material on the first electrode material; 4) disposing a second electrode material on the mixed-raw-material sheet; 5) forming a second insulating sheet made of insulating material on the second electrode material; 6) forming a first penetrating electrode electrically connected to the first electrode material while penetrating the first insulating sheet, the mixed-raw-material sheet and the second insulating sheet; 7) forming a second penetrating electrode electrically connected to the second electrode material while penetrating the first insulating sheet, the mixed-raw-material sheet and the second insulating sheet; and 8) firing the first insulating sheet, the mixed-raw-material sheet and the second insulating sheet at a temperature of 850° C. to 950° C.

Effects of the Invention

The sintered body for a zinc oxide-based varistor and the multilayer substrate using the same according to the present invention can have the extremely excellent varistor characteristics without using antimony (Sb) and rare earth elements.

The production method according to the present invention can produce a sintered body for a zinc oxide-based varistor and a multilayer substrate including the sintered body for a zinc oxide-based varistor that can have the adequate varistor characteristics by firing at a temperature lower than 1,000° C. without previously conducting a heat treatment.

MODE FOR CARRYING OUT THE INVENTION

Figure 1:
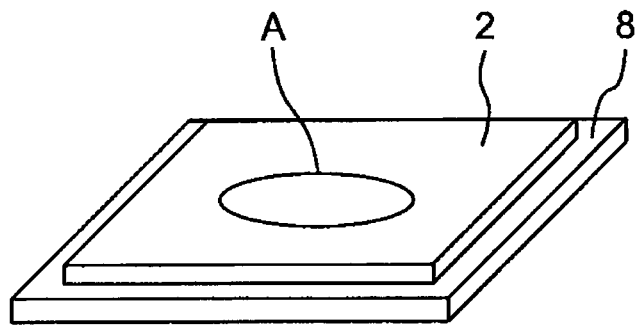
FIGS. 1(a) to 1(c) are schematic perspective views exemplifying a method for producing a sintered body for a varistor using a slurry mixed raw material.
Figure 1:
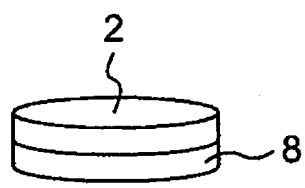
Figure 1:
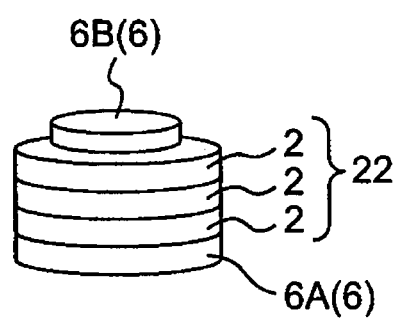

Embodiments of the present invention will be described in detail below with reference to the accompanying drawings. Although in the description below, the terms indicative of specific directions and positions (e.g., "upper", "lower", "right", "left", and other terms including these words) will be used as needed, they are used to make the present invention easy to understand with reference to the drawings, and not intended to restrict the scope of the present invention by their meanings. The same reference characters represented through the drawings denote the same parts or members.

The inventors have diligently studied the production of sintered bodies for varistors, without using antimony (Sb) and rare earth elements, that can achieve the same or greater varistor characteristics (varistor voltage, insulation resistance, and/or nonlinear resistance) than those of conventional sintered bodies for varistors using antimony (Sb) and/or rare earth elements. As a result, the inventors have created a sintered body for a zinc oxide-based varistor (including zinc oxide as a main component (that is, containing 80 mol % or more of zinc oxide in terms of zinc (Zn))). Specifically, the composition of components known in the related art, such as bismuth oxide, cobalt oxide, chrome oxide and manganese oxide, is restricted within the respective ranges specified by the inventors, while tin (Sn) is not included (with its content being set to not more than the level of impurities), which can produce a sintered body for a varistor with excellent varistor characteristics without requiring antimony (Sb) and rare earth elements. The invention has been made based on these findings.

More specifically, the sintered body for a varistor in the present invention, which can be used as the varistor, includes: zinc oxide as a main component; 0.6 to 3.0 mol % of bismuth oxide in terms of bismuth (Bi); 0.2 to 1.4 mol % of cobalt oxide in terms of cobalt (Co); 0.1 to 1.5 mol % of chrome oxide in terms of chrome (Cr); and 0.1 to 1.5 mol % of manganese oxide in terms of manganese (Mn).

Further, in the sintered body for a varistor in the present invention, the contents of antimony (Sb), rare earth element and tin (Sn) are not more than the level of impurities. The content of the antimony (Sb), rare earth element and tin (Sn) is small, for example, of zero or 0.01 mol % or less.

A method for producing a sintered body for a varistor in the present invention involves preparing a mixed raw material, and then firing the mixed raw material at a temperature ranging from 850° C. to 950° C. Specifically, in the preparation step, the mixed raw material is prepared such that a sintered body (varistor material) obtained after the firing has a composition including: zinc oxide as a main component; 0.6 to 3.0 mol % of bismuth oxide in terms of bismuth (Bi); 0.2 to 1.4 mol % of cobalt oxide in terms of cobalt (Co); 0.1 to 1.5 mol % of chrome oxide in terms of chrome (Cr); and 0.1 to 1.5 mol % of manganese oxide in terms of manganese (Mn).

In a preferred embodiment of the present invention, the method for producing a sintered body for a varistor involves mixing at least zinc oxide, bismuth oxide, cobalt oxide, chrome oxide and manganese oxide together without conducting a heat treatment to obtain a mixed raw-material, and then firing the mixed raw material at a temperature ranging from 850° C. to 950° C. Specifically, the mixed raw-material includes: zinc oxide as a main component; 0.6 to 3.0 mol % of bismuth oxide in terms of bismuth (Bi); 0.2 to 1.4 mol % of cobalt oxide in terms of cobalt (Co); 0.1 to 1.5 mol % of chrome oxide in terms of chrome (Cr); and 0.1 to 1.5 mol % of manganese oxide in terms of manganese (Mn), in which the contents of antimony (Sb), rare earth element and tin (Sn) are not more than the level of impurities.

That is, in the preferred embodiment of the present invention, the mixed raw material having substantially the same composition as that of the sintered body for a varistor, which is a target, is obtained without previously mixing two or more kinds of oxides (raw-material powder) of the plurality of kinds of oxides for use (two or more, or some of a plurality of kinds of oxides) together followed by conducting a heat treatment (for example, a heat treatment called "temporary firing") of the previously mixed oxide at 300° C. or higher before obtaining the mixed raw material. Then, the mixed raw material in the preferred embodiment is fired at a temperature ranging from 850° C. to 950° C.

The sintered body for a varistor and a method for producing a sintered body for a varistor in the present invention will be described in detail below.

1. Sintered Body for Varistor

As mentioned above, the sintered body for a varistor (sintered body) in the present invention includes: zinc oxide as a main component; 0.6 to 3.0 mol % of bismuth oxide in terms of bismuth (Bi); 0.2 to 1.4 mol % of cobalt oxide in terms of cobalt (Co); 0.1 to 1.5 mol % of chrome oxide in terms of chrome (Cr); and 0.1 to 1.5 mol % of manganese oxide in terms of manganese (Mn), in which the contents of antimony (Sb), rare-earth element and tin (Sn) are not more than the level of impurities.

In this way, the composition is restricted in the narrow range, whereby even though the mixed raw material is fired to 850° C. to 950° C., the thus-obtained sintered body for a varistor exhibits the adequate varistor characteristics, including a high nonlinear constant.

The fact that the firing can be conducted at a temperature less than 1,000° C. means that mixed raw material sheet layers (green sheet layers) containing mixed raw material powder can be fired with silver (Ag) as electrodes disposed on the mixed raw material sheet layers. In this way, the silver electrodes and the sintered body for a varistor (varistor layers obtained by firing the mixed powder) can be integrally formed to produce the multilayer substrate.

1-1. Composition

The reasons for setting the contents of respective components in the composition in the restricted ranges will be described below. Note that these reasons show those considered rational by the inventors from their findings obtained at the moment, and thus they are not intended to further restrict the scope of the present invention, such as compositions specified by claims.

Note that a mole fraction of oxide content in the present specification is determined by calculation taking into consideration only atoms (metallic atoms) bonding with oxygen, and not considering oxygen atoms contained in the oxides. The metal elements include semimetals, such as boron and silicon.

(1) Zinc Oxide

Zinc oxide is material serving as a base of the sintered body for a varistor (varistor layer) in the present invention, or a main component of the sintered body. That is, the sintered body for a varistor in the present invention contains 80 mol % or more of zinc oxide in terms of zinc (Zn).

The sintered body for a varistor in the present invention preferably contains 90 mol % or more of zinc oxide in terms of zinc (Zn).

(2) Bismuth Oxide

In the sintered body for a varistor in the present invention, the bismuth oxide content is, in terms of bismuth (Bi), 0.6 to 3.0 mol %, preferably 0.6 to 2.0 mol %, and most preferably 0.7 to 1.5 mol %.

Bismuth oxide (bismuth) promotes the densification of the sintered body even when the firing temperature is relatively low, for example, at 850° C. to 950° C. As a result of observing the microstructure of the material in the present invention by energy dispersive X-ray analysis (EDX), it is found that the segregation of the bismuth oxide (bismuth) at the grain boundary of zinc oxide and it is considered that this forms a high-resistive semiconductor grain boundary, which acts as a double Schottky barrier to exhibit the varistor characteristics. When the bismuth oxide content is less than 0.6 mol % in terms of bismuth, this effect is not sufficiently obtained. When the bismuth oxide content exceeds 3.0 mol %, crystal grains are more likely to grow, or a thick insulating film containing bismuth oxide as a main composition could be disadvantageously formed. When the bismuth oxide content is in a preferable range of 0.6 to 2.0 mol %, the above-mentioned effect can be ensured. Furthermore, when the bismuth oxide content is in the most preferable range of 0.7 to 1.5 mol %, this effect can be obtained more sufficiently.

(2) Cobalt Oxide

In the sintered body for a varistor in the present invention, the cobalt oxide content is, in terms of cobalt (Co), 0.2 to 1.4 mol %, preferably 0.2 to 1.0 mol %, and most preferably 0.3 to 0.8 mol %.

As a result of observing the microstructure of the sintered body for a varistor in the present invention by the EDX (energy dispersive X-ray analysis), cobalt oxide (cobalt) uniformly exists at the grain boundaries and inside the grains, and has a function of trapping electrons at the grain boundaries. Thus, the cobalt oxide exhibits the effect of enhancing the nonlinear constant of the sintered body for a varistor. When the cobalt oxide content is less than 0.2 mol % in terms of cobalt, this effect cannot be sufficiently obtained. Since cobalt oxide (cobalt) is uniformly dispersed within the crystal grains of zinc oxide, when the cobalt oxide content exceeds 1.4 mol %, the electrical characteristics of zinc oxide could change, causing crystal grains to easily grow. When the cobalt oxide content is within a preferable range of 0.2 to 1.0 mol %, the above-mentioned effect can be surely obtained. Further, when the cobalt oxide content is within the most preferable range of 0.3 to 0.8 mol %, the effect can be obtained more sufficiently.

(3) Chrome Oxide

In the sintered body for a varistor in the present invention, the chrome oxide content is, in terms of chrome (Cr), 0.1 to 1.5 mol %, preferably 0.1 to 1.0 mol %, and most preferably 0.2 to 0.8 mol %.

As a result of observing the microstructure of the material in the present invention by the EDX, it is found that the chrome oxide (chrome) segregates at the grain boundary of zinc oxide, thereby suppressing the crystal grain growth in the sintered body, so that fine crystal grains can be uniformly present across the entire sintered body. When the chrome oxide content is less than 0.1 mol % in terms of chrome, the above-mentioned effect is not sufficiently obtained, while when the chrome oxide content exceeds 1.5 mol %, the amount of segregated chrome oxide is increased to make the sizes of the crystal grains non-uniform. When the chrome oxide content is in a preferable range of 0.1 to 1.0 mol %, this effect can be surely obtained. Further, when the chrome oxide content is within the most preferable range of 0.2 to 0.8 mol %, the effect can be obtained more sufficiently.

(4) Manganese Oxide

In the sintered body for a varistor in the present invention, the manganese oxide content is, in terms of manganese (Mn), 0.1 to 1.5 mol %, preferably 0.1 to 1.0 mol %, and most preferably 0.3 to 0.8 mol %.

As a result of observing the microstructure of the material in the present invention by the EDX, it is found that the manganese oxide (manganese) segregates at the grain boundary of zinc oxide, thereby suppressing the crystal grain growth in the sintered body for a varistor, so that fine crystal grains can be uniformly present across the entire sintered body for a varistor. Further, the manganese oxide has the function of trapping electrons in the grain boundary and as a result, exhibits the effect of enhancing the nonlinear constant of the sintered body for a varistor. When the manganese oxide content is less than 0.1 mol % in terms of manganese, the above-mentioned effect is not sufficiently obtained, while when the manganese oxide content exceeds 1.5 mol %, the amount of segregated manganese oxide is increased to make the sizes of the crystal grains non-uniform. When the manganese oxide content is in a preferable range of 0.1 to 1.0 mol %, this effect can be surely obtained. Further, when the manganese oxide content is within the most preferable range of 0.3 to 0.8 mol %, the effect can be obtained more sufficiently.

(5) Antimony (Sb)

In the majority of conventional sintered bodies for zinc oxide-based varistors, antimony (Sb) is positively added to achieve the good varistor characteristics. This is because the use of antimony (Sb) can well control the effect of addition of other additives. However, antimony (Sb) has a problem of possessing some toxicity as mentioned above.

In the sintered body for a varistor in the present invention, the antimony (Sb) content is not more than the level of impurities (that is, antimony is included only in a content of the level of impurities or less). The term "not more than the level of impurities" as used in the present specification means zero, an amount that can be recognized as the level of impurities, or an amount lower than the level of impurities. A antimony (Sb) content as an impurity is generally for example, 0.01 mol % or less in terms of metal (at a molar ratio of 100 ppm or less), and preferably 0.005 mol % or less. In terms of actual measurement, the condition for the antimony content of 0.01 mol % or less is satisfied, for example, if the antimony content is equal to or less than the detection limit (100 ppm in units of mass ratio) of an inductively coupled plasma (ICP) wet analysis device.

(6) Rare Earth Elements

In the majority of conventional sintered bodies for zinc oxide-based varistors, rare earth elements have been intentionally added to improve the varistor characteristics.

However, in the sintered body for a varistor in the present invention, the content of the rare earth element is not more than the level of impurities.

A content of each rare earth element as an impurity (the level of impurities) is generally for example, approximately 0.01 mol % or less in terms of metal, and the total content of rare earth elements is approximately 0.05 mol % or less. Preferably, the content of each rare earth element is 0.005 mol % or less, and the total content of rare earth elements is 0.025 mol % or less. In terms of actual measurement, the condition for each rare earth element content of 0.01 mol % or less is satisfied, for example, if it is equal to or less than the detection limit (100 ppm in units of mass ratio) of an inductively coupled plasma (ICP) wet analysis device.

What kinds of elements the rare earth element includes depends on a plurality of definitions in terms of scientific or industrial aspects.

However, the term "rare earth element" as used in the present invention means yttrium (Y), lanthanum (La), cerium (Ce), praseodymium (Pr), neodymium (Nd), promethium (Pm), samarium (Sm), europium (Eu), gadolinium (Gd), tervium (Tb), dysprosium (Dy), holmium (Ho), erbium (Er), thulium (Tm), ytterbium (Yb) and lutetium (Lu).

That is, the term "rare earth element" as used in present specification does not include scandium (Sc).

The sintered body for a varistor in the present invention does not need to use the rare earth elements, which are only produced in certain area and have serious concerns about securing the stable supply over a long period of time, and whose prices are high and vary widely.

Among the rare earth elements, praseodymium (Pr) and yttrium (Y) have a problem of interfering with the densification of the sintered body during firing. In contrast, the present invention never suffers from this kind of problem.

(7) Tin (Sn)

In the majority of conventional sintered bodies for zinc oxide-based varistors, tin (Sn) has been intentionally added and positively used, for example, in the form of tin oxide. This is because the use of tin (Sn) can form a liquid phase during the firing, thus achieving the densification of the obtained sintered body.

However, based on the result of the diligent studies by the inventors, it has been found that without adding tin (Sn), a component system can be sufficiently fired at 850° C. to 950° C., thereby exhibiting the high varistor characteristics. The component system includes: zinc oxide as a main component; 0.6 to 3.0 mol % of bismuth oxide in term of bismuth (Bi); 0.2 to 1.4 mol % of cobalt oxide in terms of cobalt (Co); 0.1 to 1.5 mol % of chrome oxide in terms of chrome (Cr); and 0.1 to 1.5 mol % of manganese oxide in terms of manganese (Mn). Further, it has been also found that the addition of 0.5 mol % Sn to this composition maintains the high insulating properties, but degrades the varistor characteristics, specifically, reducing the nonlinear constant to 2 or less, which is not called the varistor characteristic.

For this reason, in the sintered body for a varistor in the present invention, the tin (Sn) content is not more than then level of impurities. A tin (Sn) content as an impurity (or the level of impurities) is generally for example, 0.01 mol % or less in terms of metal, and preferably 0.005 mol % or less. In terms of actual measurement, the condition for the tin content of 0.01 mol % or less is satisfied, for example, if it is equal to or less than the detection limit (100 ppm in units of mass ratio) of an inductively coupled plasma (ICP) wet analysis device.

(8) Other Elements

In one preferred embodiment of the present invention, the sintered body for a varistor of the present invention includes: 0.6 to 3.0 mol % of bismuth oxide in terms of bismuth (Bi); 0.2 to 1.4 mol % of cobalt oxide in terms of cobalt (Co); 0.1 to 1.5 mol % of chrome oxide in terms of chrome (Cr); and 0.1 to 1.5 mol % of manganese oxide in terms of manganese (Mn), the balance being zinc oxide and inevitable impurities.

As the level of such inevitable impurities, a content of each element is 0.03 mol % or less, and the total amount of inevitable impurities is 0.1 mol % or less as can be exemplified.

Note that the term "inevitable impurities" means the impurities normally included in the material unintentionally during the manufacturing process, during handling, or the like. If the impurities are added in the content of not more than the "level of impurities" mentioned above, even though added intentionally, they cannot exhibit the sufficient technical effects due to the addition. That is, the term "inevitable impurities" as used in the present specification means that their contents are not more than the above-mentioned "level of impurities" regardless of the intention. Since in the present invention, the contents of antimony (Sb), rare earth element and tin (Sn) are not more than the level of impurities as mentioned above, antimony (Sb), rare earth element and tin (Sn) belong to the "inevitable impurities".

However, the present invention is not limited thereto. In another preferred embodiment of the present invention, to obtain the desired varistor characteristics, anyone or two or more kinds of elements other than antimony (Sb), rare earth element and tin (Sn) may be contained.

The content of these elements in total may be, for example, 10 mol % or less, and preferably 5 mol % or less. Such a content can ensure the adequate varistor characteristics.

Now, a description will be given of elements or compounds (additives) that are added to attain the desired characteristics by way of example.

Boron Oxide

The sintered body for a varistor in the present invention may contain boron oxide, such as $B_2O_5$. In this case, the boron oxide content is 0.1 to 4.0 mol % in terms of boron (B), and preferably 0.1 to 2.0 mol %.

Boron oxide (boron) has the effect of improving the sinterability. When the boron oxide content is less than 0.1 mol % in terms of boron, this effect cannot be sufficiently obtained, while when the boron oxide content exceeds 4.0 mol %, boron oxide tends to disadvantageously form glass component with other additives, resulting in the segregation thereof. When the boron oxide content is in a preferable range of 0.1 to 2.0 mol %, this effect can be surely obtained.

Scandium Oxide

The sintered body for a varistor in the present invention may contain scandium oxide, such as $Sc_2O_3$. In this case, the scandium oxide content is, in terms of scandium (Sc), 0.1 to 2.0 mol %, and more preferably 0.4 to 0.7 mol %.

Scandium oxide (scandium) has the effect of improving the sinterability. When the scandium oxide content is less than 0.1 mol % in terms of scandium, this effect cannot be sufficiently obtained. When the scandium oxide content exceeds 2.0 mol %, the densification is less likely to occur, resulting in an increase in the amount of segregation. When the scandium oxide content is in a preferable range of 0.4 to 0.7 mol %, this effect can be obtained more sufficiently.

Barium Oxide

The sintered body for a varistor in the present invention may contain barium oxide, such as $Ba_2O$. In this case, the barium oxide content is, in terms of barium (Ba), 0.1 to 2.0 mol %, and preferably 0.2 to 1.5 mol %. The segregation of barium oxide (barium) at grain boundaries contributes to forming the preferable grain boundaries. When the barium oxide content is less than 0.1 mol % in terms of barium, this effect cannot be sufficiently obtained. When the barium oxide content exceeds 2.0 mol %, the sintering is inhibited, causing the segregation of barium oxide. When the barium oxide content is in a preferable range of 0.2 to 1.5 mol %, this effect can be obtained more sufficiently.

Zirconium Oxide, Silicon Oxide, and Tungsten Oxide

The sintered body for a varistor in the present invention may include further one or more selected from the group consisting of zirconium oxide, silicon oxide and tungsten oxide as needed.

These oxides have the effect of improving the nonlinear constant.

When the sintered body for a varistor contains zirconium oxide, the zirconium oxide content is set, in terms of zirconium (Zr), at 0.1 to 2.0 mol % (preferably at 0.2 to 1.5 mol %), and thereby can obtain the above-mentioned effect.

When the sintered body for a varistor contains silicon oxide, the silicon oxide content is set, in terms of silicon (Si), at 0.1 to 2.0 mol % (preferably at 0.2 to 1.5 mol %), and thereby can obtain the above-mentioned effect.

When the sintered body for a varistor contains tungsten oxide, the tungsten oxide content is, in terms of tungsten (W), at 0.1 to 2.0 mol % (preferably at 0.2 to 1.5 mol %), and thereby can obtain the above-mentioned effect.

1-2. Characteristics

The sintered body for a varistor in the present invention with such a composition that is obtained by firing at 850° C. to 950° C. has the following characteristics, which will be described below.

As mentioned above, the sintered body for a varistor according to the present invention has the excellent varistor characteristics. The varistor characteristics will be described in detail below.

A varistor voltage, an insulation resistance and a nonlinear resistance are known as the main varistor characteristics. These characteristics will be described below.

Varistor Voltage

A varistor (sintered body for a varistor) has the characteristic that its resistance value varies exponentially depending on a voltage applied thereto. That is, once the applied voltage exceeds a predetermined level, the electrical resistance of the varistor drops dramatically, allowing the current not running at the last moment to start to flow out abruptly.

A voltage between varistor terminals (applied voltage) when 1 mA current flows through the sintered body for the varistor is defined as a varistor voltage. The varistor voltage depends on the grain size of the varistor (varistor material) and a distance between the electrodes. These factors can be adjusted to control the varistor voltage in a certain range. To obtain some level of varistor voltage, the nonlinear constant needs to be high as will be mentioned below.

In the sintered body for a varistor in the present invention, its composition is selected to take the above-mentioned composition ranges (including the case of using an additive), whereby the varistor voltage can be controlled in a wide range of 90 to 550 V relative to a distance between the electrodes of 200 µm.

Insulation Resistance

The insulation resistance means a resistance value at one tenth of the varistor voltage.

As the insulation resistance value becomes lower, the current flows more, causing a leak current. For this reason, elements are required to have an insulation resistance of 10 MΩ or higher. When the resistance value of the element is high enough to ensure the 10 MΩ, the element has a high flexibility in design, which is preferable. The sintered body for a varistor in the present invention can obtain the high insulation resistance value, for example, of 10 GΩ.

Nonlinear Constant

The nonlinear constant can be determined by the following formula (1).

$$\text{Nonlinear constant} = \log_{10}(I1/I2)/\log_{10}(V1/V2) \quad (1)$$

where I1 is 1 mA, V1 is a voltage between the varistor terminals when a current of I1=1 mA flows, I2 is 0.01 mA, and V2 is a voltage between the varistor terminals when a current of I2=0.01 mA flows.

As the nonlinear constant becomes higher, the feedback control preferably becomes more accurate in response to the abnormal current. The majority of sintered bodies for a zinc oxide-based varistor containing rare earth elements have their nonlinear constant of 10 or more. Thus, 10 or more can be defined as a standard. Thus, the sintered body for a varistor in the present invention can obtain the nonlinear constant, for example, of 10 or more, and further 15 or more.

To obtain such excellent varistor characteristics, it is effective to control the grain size of the crystal grains. As mentioned above, in the present invention, the composition is appropriately selected to enable firing at a relatively low temperature of 850° C. to 950° C.

Thus, the grain size of the crystal grain can be set, for example, at 1 µm to 30 µm.

Note that the grain size can be determined by an intercept method. More specifically, a polished surface of the sintered body for a varistor is subjected to thermal etching at a temperature lower than the sintering temperature, making the grain boundaries clear, followed by taking micrographs through a microscope at 1,000× magnification. Then, a straight line of 100 μm in length is drawn on the micrograph, and the number of grain boundaries intersecting this straight line is counted. The length (100 μm) of the straight line is divided by the counted number of grain boundaries to thereby determine a grain size value. This work is repeated a plurality of times to calculate an average of the grain size values, thus determining the grain size.

2. Production Method for the Sintered Body for a Varistor

A method for producing the above-mentioned sintered body for a varistor will be described below.

(1) Fabrication of Mixed Raw Material (Mixed Powder)

First, a mixed raw material (mixed powder) having substantially the same composition as that of a target sintered body for a varistor is prepared. Here, the term "substantially the same composition" means that a slight difference in the composition from the obtained sintered body for a varistor is allowed, taking into consideration changes of some of the components during a firing step and the like due to the evaporation and the like.

Note that the composition of the mixed raw material (mixed powder) does not include a dispersion solvent used to promote the mixing or to hold the mixed powder in the form of slurry, and a plasticizer used to maintain the shape of the material during a sheet forming process, most of the dispersion solvent and the plasticizer being allowed to evaporate during the firing step. The dispersion solvents include, for example, ethanol, polyvinyl butyral (PVB), and the like. The plasticizer is, for example, dioctyl phthalate.

Based on the same concept, it can be said that the composition of the mixed raw material (mixed powder) does not include an organic solvent, a plasticizer, a binder, and a vehicle obtained from them that are used to form the mixed raw material into a desired shape, such as a sheet shape, and most of which tend to evaporate during the firing step.

The mixed raw material can be obtained by measuring original raw materials including oxides, such as zinc oxide, bismuth oxide, cobalt oxide, chrome oxide and manganese oxide (including the above-mentioned additives to be added as needed) to attain the substantially same composition as the target composition of the sintered body for a varistor, and then mixing these original raw materials.

The mixing may employ various known methods, regardless of the wet type or dry type.

As an example of a mixing method, a method using a ball mill can be exemplified. For example, a dispersion medium, such as ethanol, and measured original raw materials together with balls, such as zirconia balls, may be introduced into a ball mill casing and mixed by a ball mill to produce the mixed raw material.

Conventionally, in many cases, the heat treatment (temporary-heating) is performed to obtain the mixed raw material.

For example, as disclosed in Patent Document 3. to obtain the mixed raw material, parts of a plurality of kinds of original raw materials for use, including bismuth oxide, antimony oxide, and copper oxide are previously mixed and temporarily fired at a temperature of 350 to 750° C. to produce the mixed raw material, followed by firing. Likewise, as disclosed in Patent Documents 4 to 6. parts (two or more kinds) of the original raw materials for use are previously mixed and then subjected to a heat treatment at a temperature of 300° C. or higher.

Such a heat treatment is to previously mix parts of the original raw materials and diffuse their respective components in such a manner as to uniformize the composition in the sintered body after the firing.

However, the present invention preferably obtains the mixed raw material without this kind of heat treatment. Thus, the manufacturing process is simplified, which can produce the sintered body for a varistor at a lower cost.

Further, the inventors have found that the mixed raw material is obtained in this way without conducting the heat treatment, and the obtained raw material is used to be then fired at 850° C. to 950° C., thereby improving the varistor characteristic of the obtained sintered body for a varistor, especially, the nonlinear constant by 20% or more, compared to the case in which a mixed raw material subjected to the heat treatment is fired under the same conditions.

In the present invention, the contents of antimony (Sb), rare earth element and tin (Sn) are not more than the level of impurities, that is, the essential components are zinc oxide as a main component, bismuth oxide, cobalt oxide, chrome oxide and manganese oxide, which mainly consist of the components that can be diffused relatively easily during firing. Thus, the present invention is considered to result in the facts that the heat treatment is not necessary before the firing, and that the more excellent characteristics can be achieved by not conducting the heat treatment, rather than by conducting the heat treatment, which defies the common knowledge to a person skilled in the art.

Note that the term "heat treatment" as used in the present specification means the heating treatment for heating at, for example, 300° C. or higher, two or more kinds of original raw materials from the plurality of kinds of original raw materials (powder raw material) that are mixed together to obtain the desired composition, and it does not mean a heating treatment for obtaining each original raw material made of a single oxide or the like, or a heating treatment for dehydration and the like from the obtained single original raw material.

(2) Production of a Varistor Laminated Body Including the Sintered Body for a Varistor and Electrodes The obtained mixed raw material is used and formed by any known means, regardless of the dry-type or wet-type, into a formed body, which is then fired under a predetermined condition, thereby producing a sintered body.

For example, the mixed raw material may be used in the dried state and formed into a formed body (compact), followed by firing the formed body to thereby produce the sintered body.

Alternatively, the mixed raw material may be dispersed in an organic dispersion medium, such as ethanol, or an inorganic dispersion medium to make a slurry (slurry mixed raw material, paste), which may be fired to produce the sintered body.

Further, alternatively, after stirring and mixing the mixed raw material together in a vehicle obtained by mixing an organic solvent, a plasticizer and a binder together, the mixed raw material may be heated to approximately 100° C. or lower while defoaming in vacuum or the like, thereby adjusting its viscosity to produce a mixed-raw-material formed body with any shape, such as a sheet shape. These formed bodies may be laminated as needed and fired, thereby producing a sintered body.

FIGS. 1(a), 1(b) and 1(c) are schematic perspective views exemplifying a method for producing a sintered body using a slurry mixed raw material. FIG. 1(a) shows a method for obtaining a mixed-raw-material sheet from the slurry; FIG. 1(b) shows the state of punching the mixed-raw-material sheet in a desired shape; and FIG. 1(c) shows the state in which the punched mixed-raw-material sheets are laminated with electrode materials disposed thereat. Note that like FIGS. 1(a), 1(b) and 1(c), when there are drawings with the same numeral but different reference characters or alphabets (part designated by "(a)" and the like), hereinafter, they may be collectively called by the number of the figure, as "FIG. 1".

A method exemplified in FIG. 1 will be described below.

To a mixed raw material are added a dispersion medium and PVB and/or a plasticizer as needed to produce a slurry (mixed-raw-material slurry). Then, as shown in FIG. 1(a), the slurry is applied to a resin film 8 made of PET or the like and dried out, whereby a mixed-raw-material sheet 2 can be produced on the resin film 8.

The sheet is punched along the line A shown in FIG. 1(a), so that as illustrated in FIG. 1(b), the mixed-raw-material sheet 2 on the resin sheet 8 can be formed in a predetermined shape (in a disk shape shown in FIG. 1(b)).

The mixed-raw-material sheet 2 is removed from the resin film 8, and then as shown in FIG. 1(c), a plurality of (three in FIG. 1(c)) of mixed-raw-material sheets 2 are laminated on each other to thereby form a mixed-raw-material sheet laminated body 22. A first electrode sheet 6A (e.g., a silver (Ag) electrode sheet) is laminated on the lower surface of the mixed-raw-material sheet laminated body 22, and a second electrode sheet 6B (a silver (Ag) electrode sheet) is laminated on the upper surface of the mixed-raw-material sheet laminated body 22.

Thereafter, the laminated body and electrode sheets are pressed not to cause a short circuit between the first electrode sheet 6A (electrode sheet 6) and the second electrode sheet 6B (electrode sheet 6) to thereby make pressure contact (pressure bonding) between the adjacent mixed-raw-material sheets 2, between the mixed-raw-material sheet 2 and the first electrode sheet 6A, and between the mixed-raw-material sheet 2 and the second electrode sheet 6B. The pressing is performed, preferably, by heating at a temperature of 100° C. or lower.

The mixed-raw-material sheet laminated body 22 with the first electrode sheet 6A on its lower surface and the second electrode sheet 6B on its upper surface is fired.

The firing is performed at a firing temperature of 850° C. to 950° C.

The firing may be performed in the air, and alternatively may be performed in an oxygen atmosphere as needed.

Such firing can produce the varistor laminated body 22 (sintered body) having a first electrode 6A (e.g., silver electrode) on its lower surface and a second electrode 6B (e.g., silver electrode) on its upper surface.

Note that although in the embodiment shown in FIG. 1, a plurality of the mixed-raw-material sheets 2 is laminated, alternatively, one piece of mixed-raw-material sheet 2 with the first electrode sheet 6A formed at its lower surface and the second electrode sheet 6B formed at its upper surface may be fired to produce a sintered body.

3. Multilayer Substrate and Production Method Therefor
(1) Multilayer Substrate (Basic Structure of a Multilayer Substrate Incorporating Therein a Varistor) and Production Method Therefor The multilayer substrate (basic structure of the multilayer substrate incorporating therein the varistor) will be described below as one example of applications for the above-mentioned sintered body for a varistor.

Figure 2:
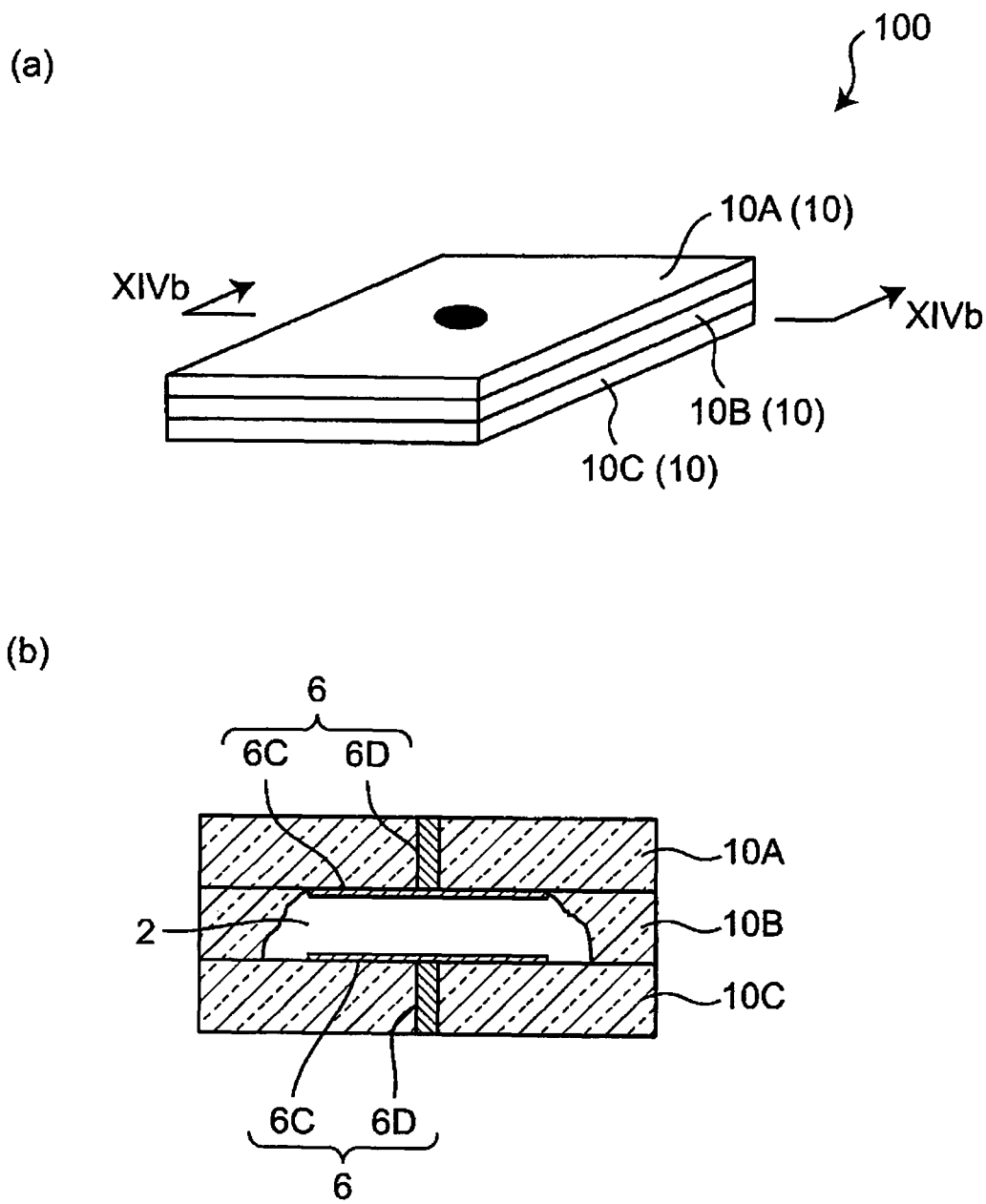
FIG. 2(a) is a perspective view of a multilayer substrate 100.
FIG. 2(b) is a cross-sectional view taken along the line XIVb-XIVb of FIG. 2(a).

FIG. 2(a) is a perspective view of a multilayer substrate 100 as the basic structure of the multilayer substrate of the present invention, and FIG. 2(b) is a cross-sectional view taken along the line XIVb-XIVb of FIG. 2(a).

The multilayer substrate 100 includes a first insulating layer 10A (insulating layer 10), a second insulating layer 10B (insulating layer 10), and a third insulating layer 10C (insulating layer), which are laminated on each other in this order (in the order from the upper side in the embodiment shown in FIG. 2(a)). A varistor layer 2 is disposed within the second insulating layer 10B. In the embodiment illustrated in FIG. 2(b), the varistor layer 2 is disposed within a through hole penetrating the second insulating layer 10B.

Internal electrodes 6C are disposed at the respective upper and lower surfaces of the varistor layer 2.

The internal electrode 6C disposed at the upper surface of the varistor layer 2 is connected to a penetrating electrode 6D that penetrates the first insulating layer 10A to thereby form an electrode 6. The electrode 6 enables electric connection between the varistor layer 2 and the upper surface of the first insulating layer 10A (the part of the penetrating electrode 6D exposed from the upper surface of the first insulating layer 10A).

Likewise, the internal electrode 6C disposed at the lower surface of the varistor layer 2 is connected to the penetrating electrode 6D that penetrates the third insulating layer 10C to thereby form an electrode 6. The electrode 6 enables electric connection between the varistor layer 2 and the lower surface of the third insulating layer 10C (the part of the penetrating electrode 6D exposed from the lower surface of the third insulating layer 10C).

The two internal electrodes 6C are counter electrodes that are facing each other with the varistor layer 2 disposed therebetween. With the structure of this part, once abnormally high voltage (high current) is generated between the two internal electrodes 6C due to noise and the like, the current is allowed to flow through the varistor layer 2. This basic structure is used to form the structure of the multilayer substrate (an example of application as an interposer) or the like to be mentioned below, whereby once the abnormally high voltage is generated, the current hardly flows through a protection target device such as a semiconductor chip, which can protect these devices. The basic structure partially incorporating the varistor layer in an insulating layer, like the multilayer substrate 100, is applied to a high-speed communications module, an interposer, and the like. Thus, electric wires formed by the electrodes are disposed substantially within the insulating layer, which can achieve the multilayer substrate that takes advantage of excellent transmission characteristics of the insulating layer.

A method for producing a multilayer substrate 100 will be described below.

FIGS. 3(a) to 3(d) are perspective views showing a method for producing a laminated body 150. First of all, the laminated body 150 is fabricated as follows.

As shown in FIG. 3(a), an insulating sheet 10, which will become the insulating layer by the firing, is prepared, and then as shown in FIG. 3(b), a through hole 14 is formed in the insulating sheet 10. The insulating sheet 10 may be fabricated, for example, by mixing a mixed raw material for an insulating sheet with a binder to make a slurry, applying the slurry onto a resin sheet using a sheet forming machine by a doctor blade method, drying, and then removing the resin sheet, or the like.

A silver electrode paste is charged into the through hole 14 in the insulating sheet 10 and dried, thereby forming an electrode paste layer 6D serving as the penetrating electrode 6D after firing.

Figure 3:
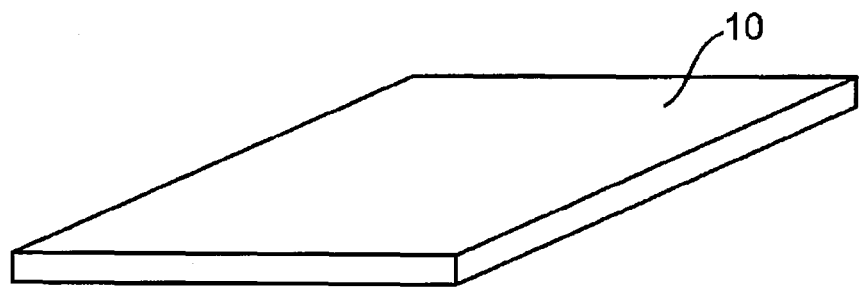
FIGS. 3(a) to 3(d) are perspective views showing a method for producing a laminated body 150.
Figure 3:
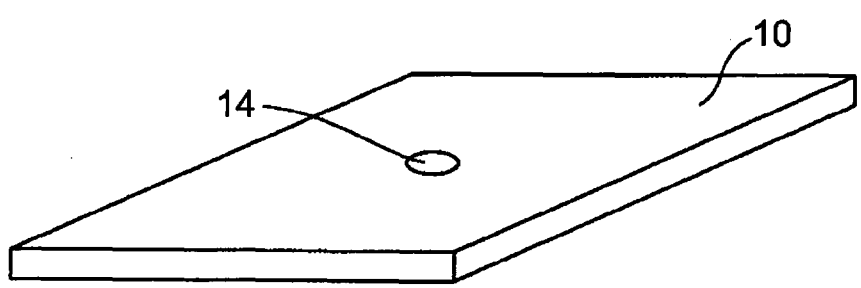
Figure 3:
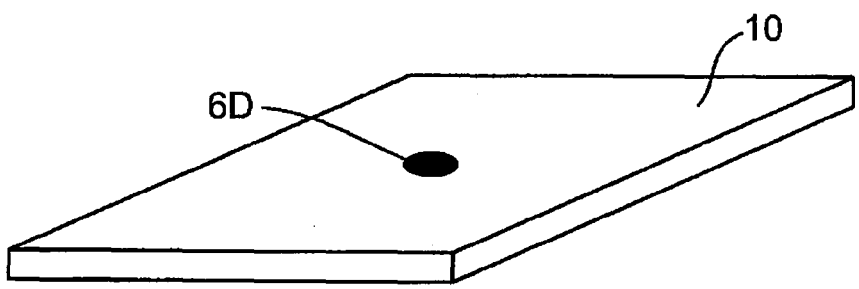
Figure 3:
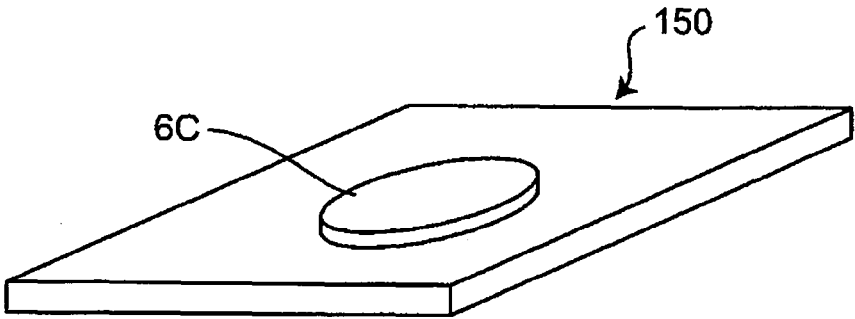

Then, as shown in FIG. 3(*d*), a silver electrode paste is applied on the surface of the insulating sheet 10 by a screen printing method and dried, or the like, thereby forming the electrode paste layer 6C on the upper surface of the insulating sheet 10 to be in contact with the electrode paste layer 6D.

In this way, the laminated body 150 can be obtained. The two laminated bodies 150 are fabricated.

Figure 4:
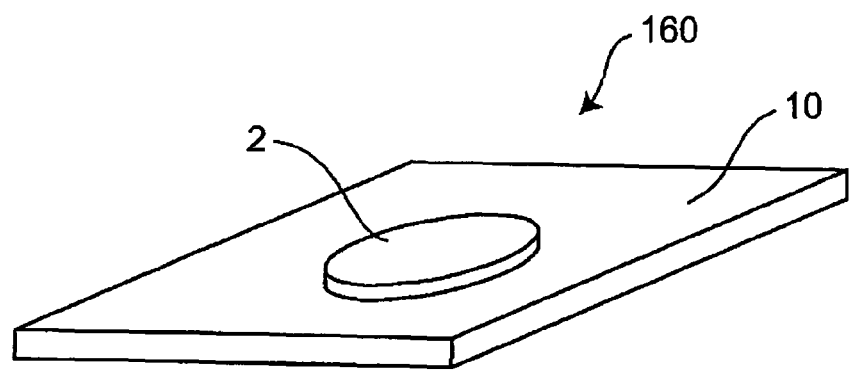
FIG. 4 is a perspective view showing a laminated body 160.

Next, a laminated body 160 is formed. FIG. 4 is a perspective view showing the laminated body 160. The laminated body 160 includes the laminated body 150 with the surface (at least a main surface) of the electrode paste layer 6C covered with the varistor slurry layer 2.

One of the two laminated bodies 150 can be used to form the laminated body 160 by the following way.

Original raw materials are mixed by a ball mill or the like, and then dried and crushed to produce a mixed raw material (mixed dried powder) having the above-mentioned predetermined components. Then, the mixed raw material is dispersed in an organic dispersion medium (vehicle), such as ethanol, or inorganic dispersion medium, thereby producing a mixed-raw-material slurry.

The mixed-raw-material slurry obtained in this manner is applied by a method, such as a screen printing method, to cover at least a main surface of the exposed surface of the electrode paste layer 6C of the laminated body 150. The applied slurry is then dried, which can produce the laminated body 160 including the insulating sheet 2, the penetrating electrode 6D, the electrode paste layer 6C and the varistor slurry layer 2.

Figure 5:
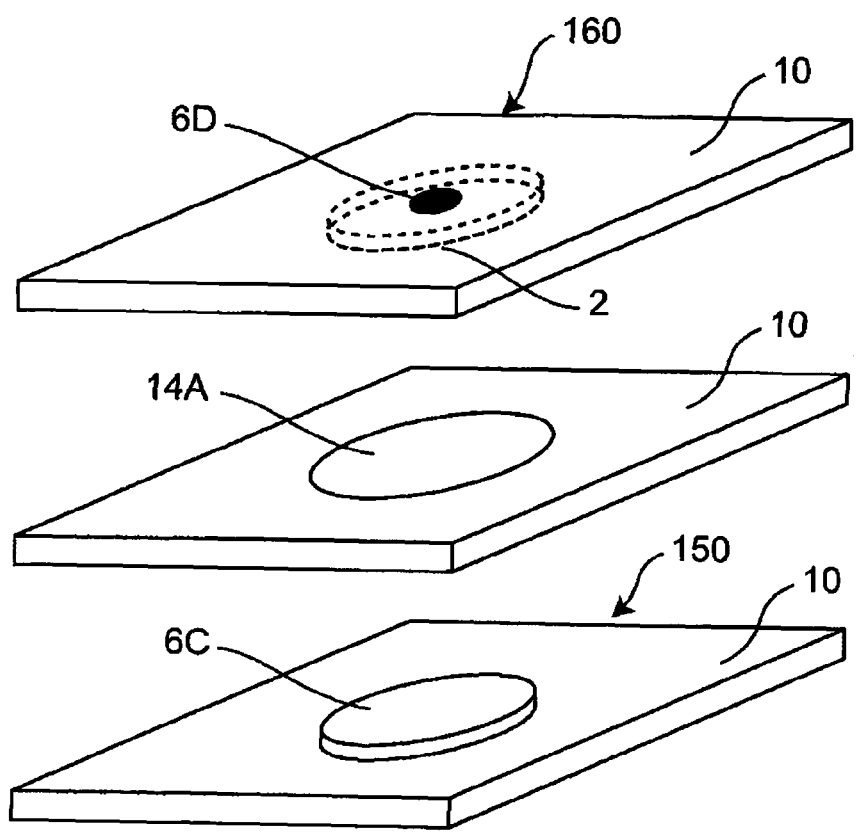
FIG. 5 is a diagram showing a method for producing a multilayer substrate 100.

FIG. 5 is a diagram showing a method for producing a multilayer substrate 100.

The pressing step for obtaining a composite laminated body will be described below with reference to FIG. 5.

The laminated body 160 (electrode paste layer 6C not shown in the figure), the insulating sheet 10 having a through hole 14A, and the laminated body 150 are arranged sequentially from the upper side so as to align the varistor slurry layer 2, through hole 14A, and electrode paste layer 6C with each other as shown in FIG. 5. The laminated body 160 is disposed with the varistor slurry layer 2 positioned on its lower surface side. The through hole 14A is capable of accommodating therein the varistor slurry layer 2 of the laminated body 160 and the electrode paste layer 6C of the laminate body 150. The laminated body 150 is disposed with the electrode paste layer 6C positioned on its upper surface side.

The respective insulating sheets 10 of the laminated bodies 150 and 160 are brought into contact with the insulating sheet 10 having the through hole 14A, whereby the electrode paste layer 6C and the varistor slurry layer 2 in the laminated body 160 and the electrode paste layer 6C of the laminated body 150 are laminated within the through hole 14A.

In this state, these laminated layers are pressed to produce a composite laminated body.

The thus-obtained composite laminated body is fired at a temperature of 850° C. to 950° C. In this way, the multilayer substrate 100 can be obtained.

Figure 6:
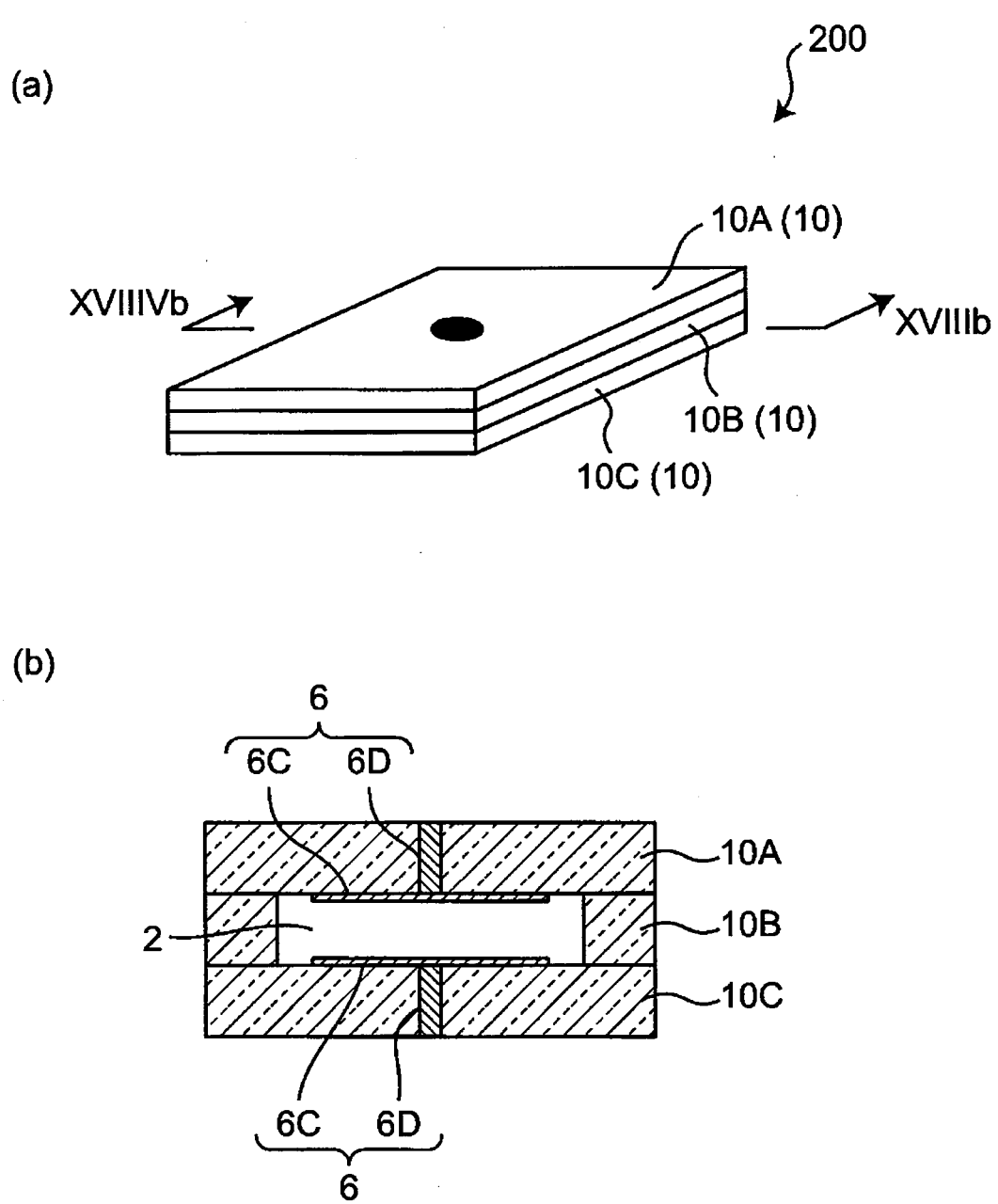
FIG. 6(a) is a perspective view of a multilayer substrate 200.
FIG. 6(b) is a cross-sectional view taken along the line XVIIIb-XVIIIb of FIG. 6(a).

(2) Multilayer Substrate (in Modification of the Basic Structure of a Multilayer Substrate Incorporating Therein a Varistor) and Production Method Therefor FIG. 6(*a*) is a perspective view of a multilayer substrate 200 in modification, and FIG. 6(*b*) is a cross-sectional view taken along the line XVIIIb-XVIIIb of FIG. 6(*a*).

The multilayer substrate 200 has the same structure as that of the multilayer substrate 100. That is, the multilayer substrate 200 includes a first insulating layer 10A (insulating layer 10), a second insulating layer 10B (insulating layer 10), and a third insulating layer 100 (insulating layer), which are laminated on each other in this order (from the upper side in an embodiment shown in FIG. 6(*a*)). The varistor layer 2 is disposed within the second insulating layer 10B. In the embodiment illustrated in FIG. 6(*b*), the varistor layer 2 is disposed within a through hole penetrating the second insulating layer 10B.

In the multilayer substrate 100, the varistor layer 2 is formed by firing the varistor slurry layer 2, while in the multilayer structure 200, the varistor layer 2 is formed of the mixed-raw-material sheet 2 shown in FIG. 1(*a*). The mixed-raw-material sheet 2 normally has high stiffness, compared to the varistor slurry layer 2, with less deformation by the pressing process. This advantageously results in small variations in the thickness within the obtained varistor layer 2, leading to a small difference in thickness between the center part and end part of the varistor layer 2.

In the method for producing a multilayer substrate 200, when forming the laminated body 160, the same method for producing a laminated body 100 may be used except that the mixed-raw-material sheet 2 is placed to cover the surface (at least a main surface) of the electrode paste layer 6D, instead of covering the surface (at least a main surface) of the electrode paste layer 6D with the varistor slurry layer 2.

(3) Multilayer Substrate (Application as an Interposer)

The multilayer substrate (which is an application as an interposer), which is one example of applications for the above-mentioned sintered body for a varistor, will be described below. The multilayer substrate is just one example of applications for the sintered body for a varistor in the present invention. In addition to this, the sintered body for a varistor in the present invention can be used for many applications, including, e.g., a magnetic sensor substrate, a current sensor substrate, a LED supporter, and a substrate for a high-frequency communication circuit.

Figure 7:
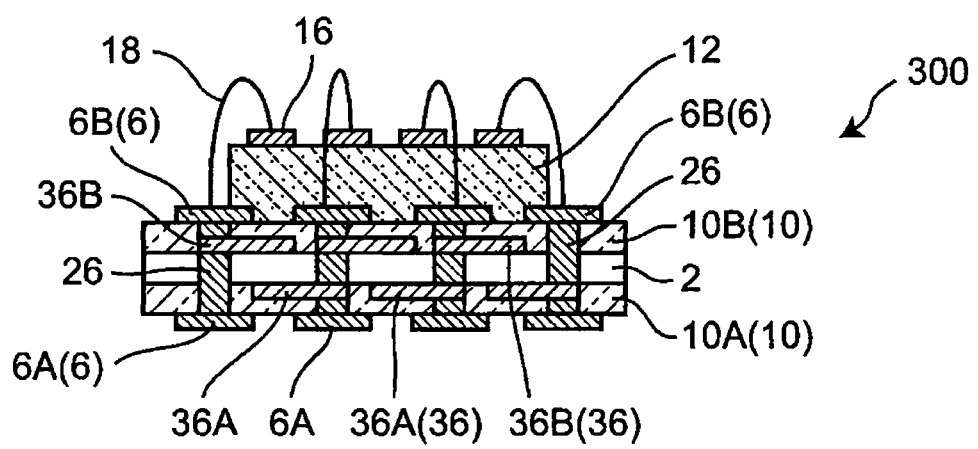
FIG. 7 is a cross-sectional view showing a multilayer substrate 300.

FIG. 7 is a cross-sectional view of a multilayer substrate (interposer) 300 in one embodiment of the present invention.

The multilayer substrate 300 includes a first insulating layer 10A (insulating layer 10), a varistor layer 2 disposed on the first insulating layer 10A and made of the above-mentioned sintered body for a varistor (sintered body), and the second insulating layer 10B (insulating layer 10) disposed on the varistor layer 2. That is, the varistor layer 2 is sandwiched between the first insulating layer 10A and the second insulating layer 10B. The insulating layers 10A and 10B may be formed of any insulating material, for example, a glass ceramic layer.

A plurality of first surface electrodes 6A (surface electrodes 6) is provided at a main surface (lower surface shown in FIG. 7) of the first insulating layer 10A on the side opposite to the varistor layer 2. A plurality of second surface electrodes 6B (surface electrodes 6) is provided at a main surface (upper surface shown in FIG. 7) of the second insulating layer 10B on the side opposite to the varistor layer 2.

A plurality of first internal electrodes 36A (internal electrodes 36) is provided at a main surface (lower surface shown in FIG. 7) of the varistor layer 2 on the first insulating layer 10A side. A plurality of second internal electrodes 36B (internal electrodes 36) is provided at a main surface (upper surface shown in FIG. 7) of the varistor layer 2 on the second insulating layer 10B side.

Furthermore, a plurality of penetrating electrodes 26 is provided to penetrate the first insulating layer 10A, the varistor layer 2 and the second insulating layer 10B.

One first surface electrode 6A, one penetrating electrode 26, at least one of one first internal electrode 36A and one second internal electrode 36B, and one second surface electrode 6B are electrically connected to each other (note that one first surface electrode 6A, one penetrating electrode 26, at least one of one first internal electrode 36A and one second internal electrode 36B (in the embodiment shown in FIG. 7, both one first internal electrode 36A and one second internal electrode 36B), and one second surface electrode 6B are electrically connected together, and thus collectively called a "group electrode".)

In the embodiment shown in FIG. 7, one first surface electrode 6A, one penetrating electrode 26, one first internal electrode 36A, one second internal electrode 36B, and one second surface electrode 6B are electrically connected to each other, but the present invention is not limited thereto.

For example, in the embodiment illustrated in FIG. 5(h) i) and ii) to be mentioned in detail below, the penetrating electrode 26 is electrically connected to one first surface electrode 6A, at least one of one first internal electrode 36A and one second internal electrode 36B, and one second surface electrode 6B.

That is, the penetrating electrode 26 has only to be electrically connected to one first surface electrode 6A, at least one of one first internal electrode 36A and one second internal electrode 36B, and one second surface electrode 6B.

The end surface of the penetrating electrode 26 exposed from the first insulating layer 10A may be used as the first surface electrode 6A, and the end surface of the penetrating electrode 26 exposed from the second insulating layer 10B may be used as the second surface electrode 6B.

Regarding the electric connection in the group electrode, preferably, as illustrated in FIG. 7, the penetrating electrode 26 is directly electrically connected to one first surface electrode 6A, at least one of one first internal electrode 36A and one second internal electrode 36B, and one second surface electrode 6B.

The first surface electrode 6A, the penetrating electrode 26, the first internal electrode 36A, the second internal electrode 36B and the second surface electrode 6B are preferably formed of silver or a silver alloy with excellent conductivity.

A semiconductor chip (element) 12 can be placed on such a multilayer substrate 300. An electrode 16 of the semiconductor chip 12 is electrically connected to the second surface electrode 6B. In the embodiment shown in FIG. 7, the electrodes 16 of the semiconductor chip 12 are electrically connected to the second surface electrodes 6B via wires 18. However, the present invention is not limited thereto. Alternatively, the electrodes 16 may be electrically connected to the second surface electrodes 6B by using any well-known method, such as bumps or solder.

(4) Production Method for the Multilayer Substrate (Application as an Interposer)

A method for producing a multilayer substrate 300 will be described below.

Figure 8:
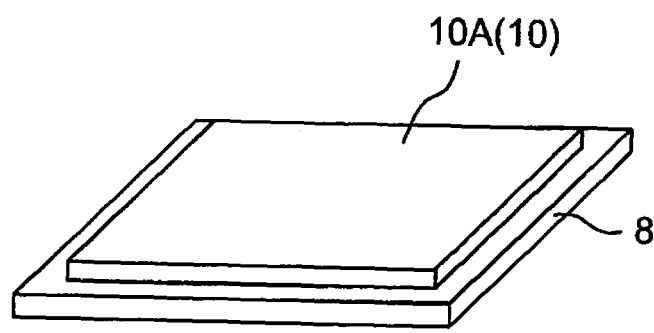
FIGS. 8(a) to (d) are diagrams showing a method for producing a multilayer substrate.
Figure 8:
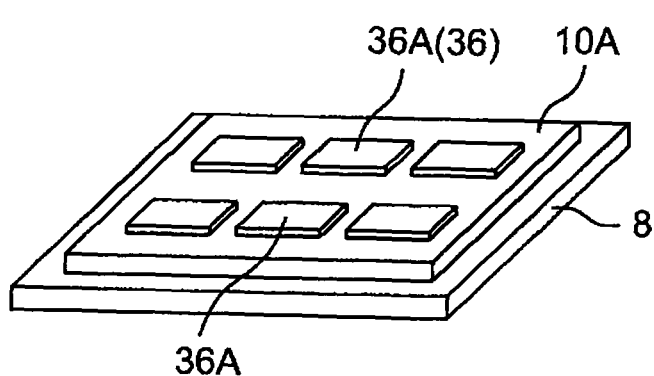
Figure 8:
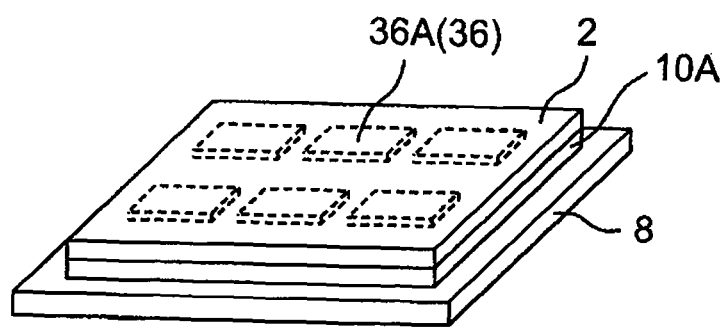
Figure 8:
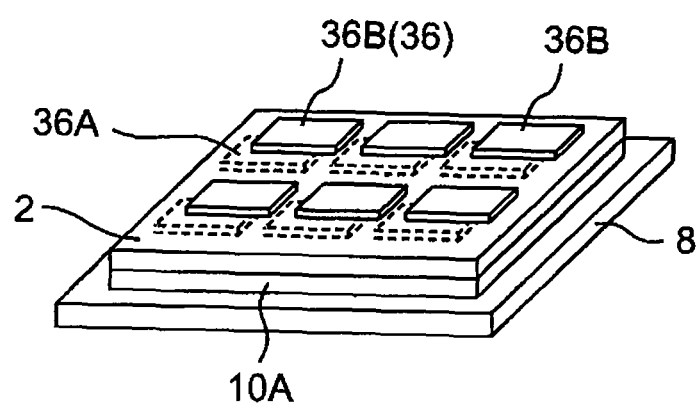
Figure 9:
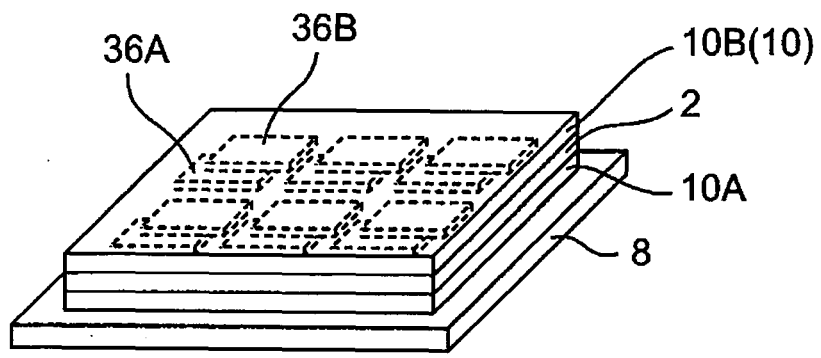
FIGS. 9(e) and (f) are diagrams showing a method for producing a multilayer substrate.
Figure 9:
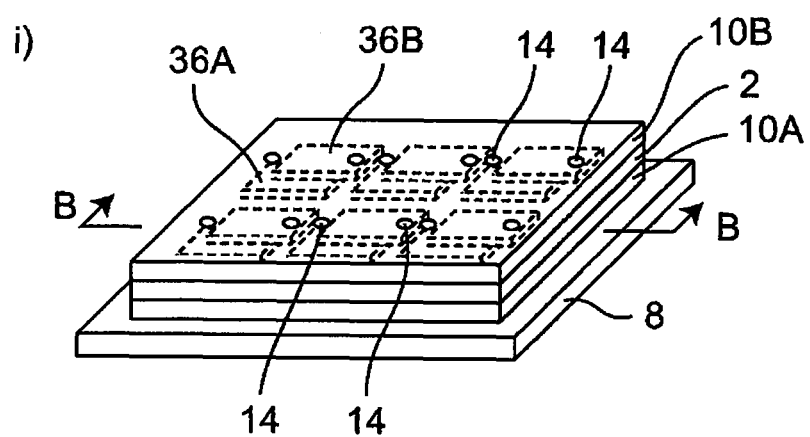
Figure 9:
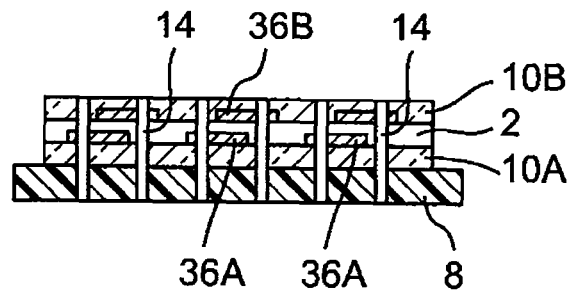
Figure 10:
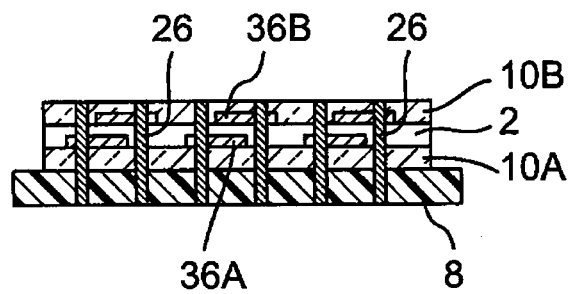
FIGS. 10(g) and (h) are diagrams showing a method for producing a multilayer substrate.
Figure 10:
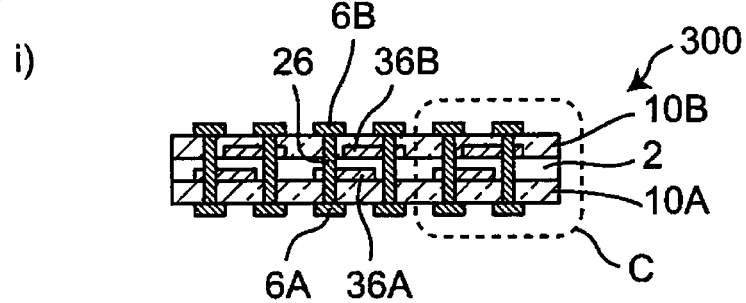
Figure 10:
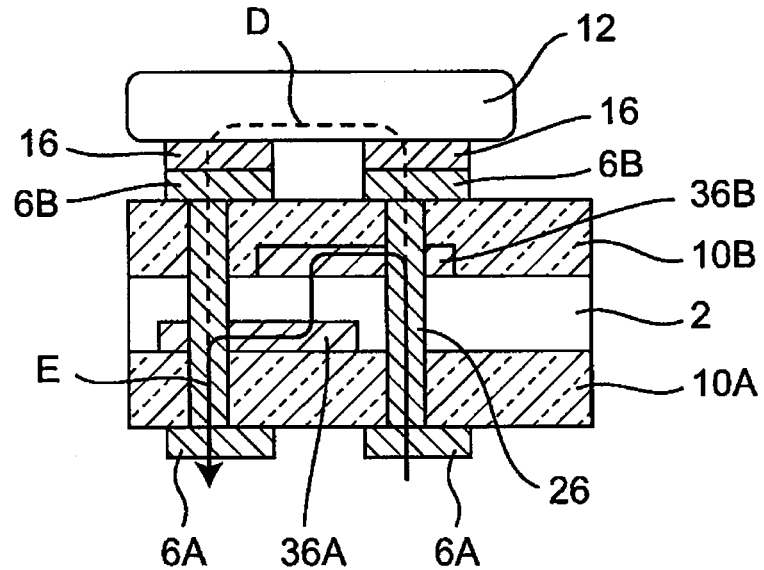

FIGS. 8 to 10 are diagrams showing a method for producing a multilayer substrate 300. FIG. 9(f) ii) is a cross-sectional view taken along the line B-B of FIG. 9(f) i), and FIG. 10(h) ii) is an enlarged view of a part enclosed by a dotted line C of FIG. 10(h) i). FIGS. 8, 9(e) and 9(f) i) are perspective views, while FIG. 9(f) ii) and FIG. 10 are cross-sectional views.

As shown in FIG. 8(a), the first insulating sheet (sheet converted into an insulating layer by being fired) 10A are disposed on the resin sheet 8, for example, by mixing a mixed raw material for an insulating sheet with a binder to make a slurry, applying the slurry onto the resin sheet 8 using a sheet forming machine by a doctor blade method, and then drying it out and the like.

Then, as shown in FIG. 8(b), the first internal electrodes 36A are formed on the upper surface (for example, part of the upper surface) of the first insulating sheet 10A by the screen printing or the like.

Next, as shown in FIG. 8(c), the mixed-raw-material sheet 2 is formed to cover the upper surface of the first insulating sheet 10A (part without having the first internal electrode 36A formed) and the first internal electrode 36A.

The mixed-raw-material sheet 2 may be formed by mixing the above-mentioned mixed raw material with a binder to make a slurry, applying the slurry and drying it.

More specifically, an example of a formation method for the mixed-raw-material sheet 2 will be described below. The original raw materials measured to have the predetermined composition are mixed in a ball mill or the like, then dried, crushed and granulated through a sieve with 100 to 500 µm to thereby obtain the mixed raw material.

The mixed raw material (granulated powder) is introduced at a predetermined ratio into the vehicle made by mixing an organic solvent, such as ethanol, a dispersion medium, and an organic binder, and they are mixed together by a propeller stirrer or the like. After homogenizing the mixture, the viscosity of the mixture is adjusted by increasing its temperature while defoaming in vacuum, thus fabricating a mixed-raw-material slurry.

The mixed-raw-material slurry is applied to cover the upper surface of the first insulating sheet 10A and the first internal electrode 36A by screen printing or the like and then dried, whereby the mixed-raw-material sheet 2 can be obtained.

Then, as shown in FIG. 8(d), the second internal electrode 36B is formed on the mixed-raw-material sheet 2 by the screen printing or the like.

Then, the second insulating sheet (sheet to be converted into the insulating layer by being fired) 10B is formed by the screen printing or the like to cover the mixed-raw-material sheet 2 (part thereof with no second internal electrode 36B formed) and the second internal electrode 36B.

Next, as shown in FIG. 9(f) i) and ii), two kinds of through holes 14 are formed by using the known penetrating means, such as laser machining. One of them is the through hole 14 rates the first insulating sheet 10A, the first internal electrode 36A, the mixed-raw-material sheet 2, and the second insulating sheet 10B. The other of them is the through hole 14 that penetrates the first insulating sheet 10A, the mixed-raw-material sheet 2, a second internal electrode 32B, and the second insulating sheet 10B.

As shown in FIG. 10(g), the penetrating electrode 26 is formed in the penetrating hole 14. The penetrating electrode 26 can be formed by supplying silver (silver particles) into the through hole, for example, by the screen printing.

Then, after removing the resin sheet 8, firing is performed. The pressure-contacting may be performed using a pressing device or the like before the firing. The pressure-contacting is preferably performed by heating at 75° C. to 85° C. at a pressing pressure of 50 kgf/cm$^2$ or higher. The firing is performed at a temperature of 850° C. to 950° C. This can prevent the damage to the penetrating electrode 26, the first internal electrode 36A and the second internal electrode 36B made of, for example, silver or the like.

As shown in FIG. 10(*h*) i), after the firing, the first surface electrodes 6A are formed at the lower surface of the first insulating layer 10A, and the second surface electrodes 6B are formed at the upper surface of the second insulating layer 10B. The first surface electrodes 6A and the second surface electrodes 6B may be, for example, a plating electrode pad.

In this way, the multilayer substrate 300 can be obtained.

Although in the above-mentioned production method, the slurry for an insulating sheet and the mixed-raw-material slurry are applied sequentially and dried out, the respective sheets may be formed individually and laminated in turn as mentioned in the chapter of "multilayer substrate (modification of a basic structure)" mentioned above.

The function of the multilayer substrate 300 in the present invention will be described using FIG. 10(*h*) ii), which is an enlarged view of a part enclosed by a dotted line C in FIG. 10(*h*) i). FIG. 10(*h*) ii) also shows the semiconductor chip 12 disposed on the multilayer substrate 300 for explanation.

FIG. 10(*h*) ii) shows two group electrodes. One of them is a group electrode positioned on the left side of the figure and including the first surface electrode 6A, the penetrating electrode 26, the first internal electrode 36A and the second surface electrode 6B (hereinafter referred to as a "left group electrode" for convenience). The other of them is a group electrode positioned on the right side of the figure and including the first surface electrode 6A, the penetrating electrode 26, the second internal electrode 36B and the second surface electrode 6B (hereinafter referred to as a "right group electrode" for convenience).

The second surface electrode 6B of the right group electrode is electrically connected to the electrode 16 of the semiconductor chip 12. Likewise, the surface electrode 6B of the left group electrode is electrically connected to another electrode 16 of the semiconductor chip 12.

In this way, during the normal use, that is, when the high voltage does not occur due to noise and the like, as indicated by a dotted line D, the current entering the first surface electrode 6A of the right group electrode flows through the inside of the semiconductor chip 12 via the penetrating electrode (second penetrating electrode) 26 in the right group, and the second surface electrode 6B in the right group and the electrode 16 of the semiconductor chip. Then, the current passes from another electrode 12 of the semiconductor chip 12 through the second surface electrode 6B in the left group electrode and the penetrating electrode (first penetrating electrode) 26 in the left group electrode to leave the first surface electrode 6A in the left group electrode. In this way, the current is supplied to the semiconductor chip 12.

However, once the abnormally high voltage (high current) occurs due to noise or the like, the high voltage is applied, causing the electrical resistance of the varistor layer 2 to drop drastically. Thus, the high current entering the first surface electrode 6A in the right group electrode proceeds along the arrow E. That is, the current flowing through the right group electrode passes through the first surface electrode 6A in the right group electrode and the penetrating electrode (second penetrating electrode) 26 in the right group electrode, and then enters the varistor layer 2 from the second internal electrode 36B in the right group electrode. Further, the current enters the left group electrode from the first internal electrode 36A of the left group electrode and then passes through the penetrating electrode (first penetrating electrode) 26 in the left group electrode to leave the first surface electrode 6A in the left group electrode.

As a result, the semiconductor chip 10 is hardly allowed the current to flow therethrough, thus enabling the protection of the semiconductor chip 12 from the abnormally high voltage.

Note that in the embodiment shown in FIG. 10(*h*) i) and ii), the first penetrating electrode (penetrating electrode in the left group electrode) 26 is electrically connected to the first internal electrode 36A, but not electrically connected to the second internal electrode 36B. In addition, the second penetrating electrode (penetrating electrode in the right group electrode) 26 is electrically connected to the second internal electrode 36B, but not electrically connected to a first internal electrode 26B.

However, the present invention is not limited to this embodiment. Any other structure can be taken as long as the current flows between the first internal electrode 36A electrically connected to the first penetrating electrode 26 and the second internal electrode 36B electrically connected to the second penetrating electrode 26, through the varistor layer 2 when the high voltage is applied.

For example, in the embodiment shown in FIG. 7, the first penetrating electrode 26 (the second penetrating electrode 26 from the left side in FIG. 7) may be electrically connected to the first internal electrode 36A and the second internal electrode 36B, while the second penetrating electrode 26 (the third penetrating electrode from the left side in FIG. 7) may be electrically connected to another first internal electrode 36A and second internal electrode 36B.

Another method for producing a multilayer substrate (application as an interposer) will be described below.

Figure 11:
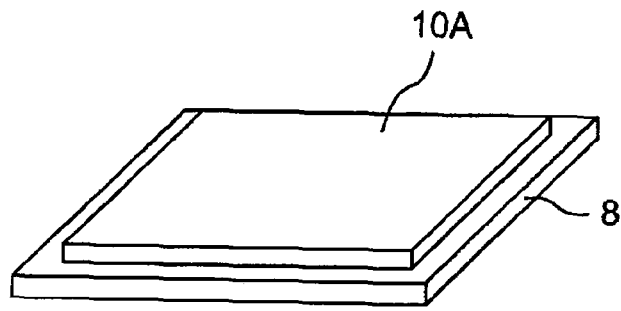
FIGS. 11(a) to 11(d) are diagrams showing another method for producing a multilayer substrate.
Figure 11:
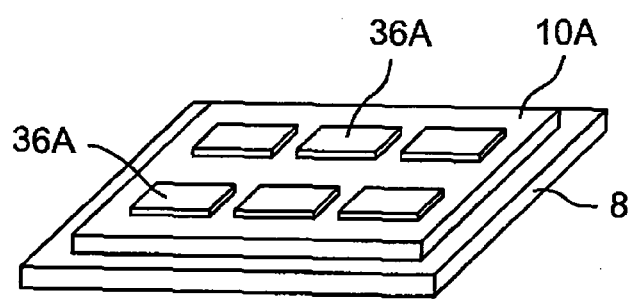
Figure 11:
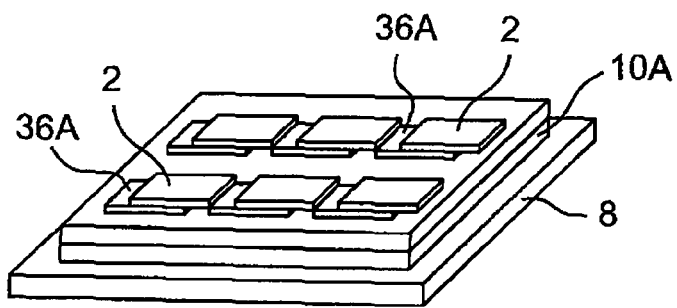
Figure 11:
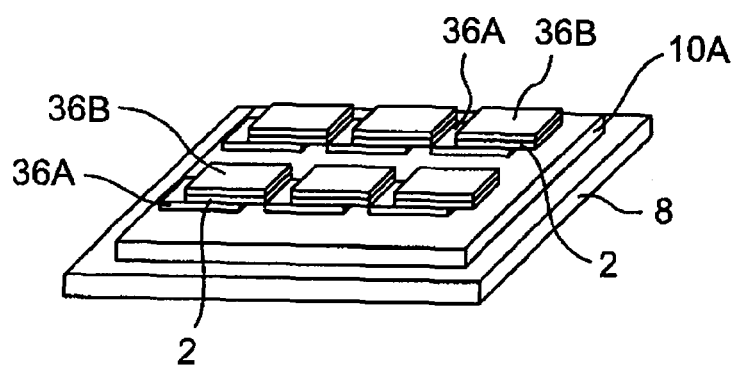
Figure 12:
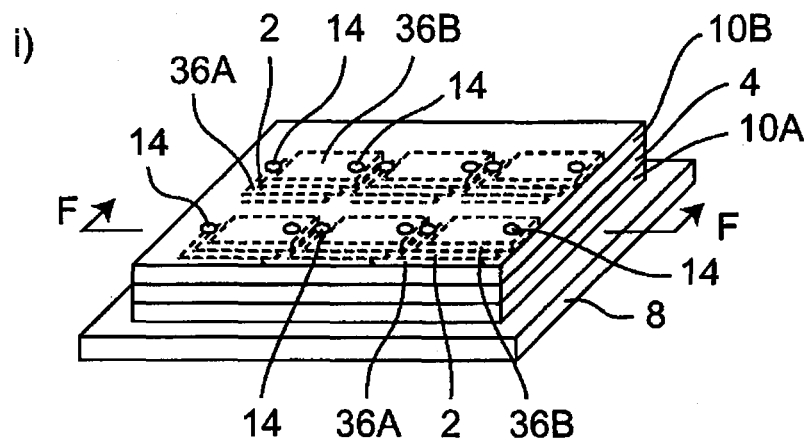
FIGS. 12(e) and 12(f) are diagrams showing another method for producing a multilayer substrate.
Figure 12:
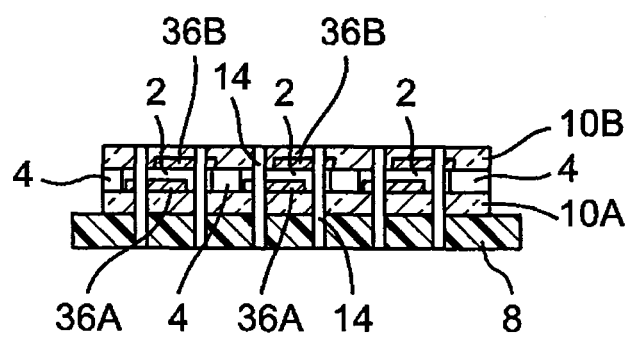
Figure 12:
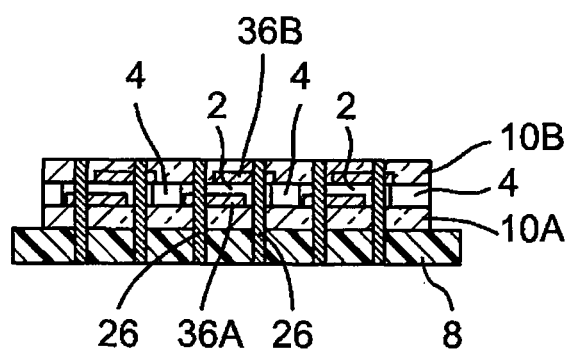
Figure 13:
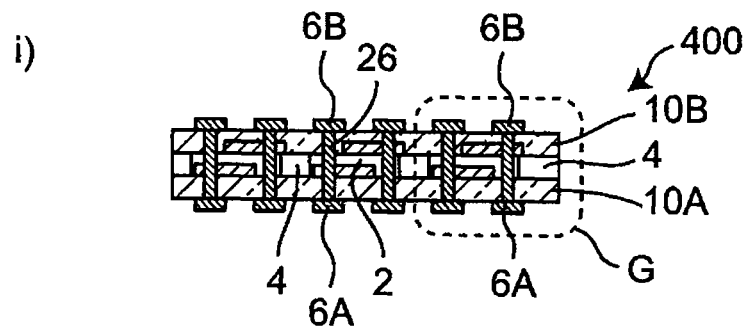
FIGS. 13(g) i) and 13(g) ii) are diagrams showing another method for producing a multilayer substrate.
Figure 13:
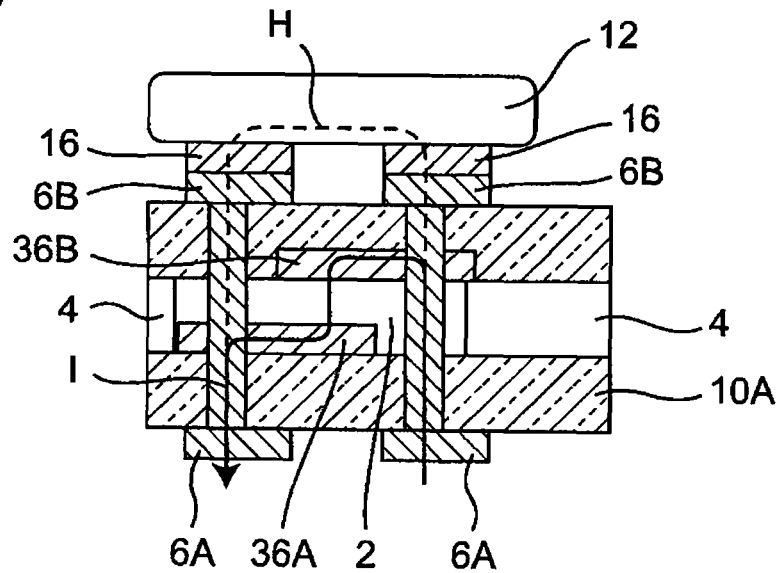

FIGS. 11 to 13 are diagrams showing another method for producing a multilayer substrate 400. FIG. 12(*e*) ii) is a cross-sectional view taken along the line F-F of FIG. 12(*e*) i), and FIG. 13(*g*) ii) is an enlarged view of a part enclosed by a dotted line G of FIG. 13(*g*) i). FIGS. 11 and 12(*e*) i) are perspective views, while FIG. 12(*e*) ii), FIG. 12(*f*), and FIG. 13 are cross-sectional views.

As shown in FIG. 11(*a*), the first insulating sheet 10A is disposed on the resin sheet 8, for example, by mixing a mixed raw material for an insulating sheet with a binder to make a slurry, applying the slurry onto the resin sheet 8 using a sheet forming machine by the doctor blade method, and then drying it out or the like.

Then, as shown in FIG. 11(*b*), the first internal electrodes 36A are formed on the upper surface (for example, part of the upper surface) of the first insulating sheet 10A by the screen printing or the like.

Then, as shown in FIG. 11(*c*), the mixed-raw-material sheets 2, each having substantially the same area as the upper surface of the first internal electrode 36A, are formed in such a manner as to be slightly displaced from the first internal electrodes 36A (to be displaced in a certain direction (rightward as shown in FIG. 11(*c*)) in order to have their major parts superimposed over the first internal electrodes 36A but other parts not superimposed over the first internal electrodes 36A).

The mixed-raw-material sheets 2 may be formed, for example, by screen-printing the slurry mixed raw material.

Then, as shown in FIG. 11(*d*), the second internal electrodes 36B are formed on the mixed-raw-material sheet 2 by the screen printing or the like.

Subsequently, as shown in FIG. 12(*e*) i) and ii), the second insulating sheet 10B (sheet to be converted into the insulating layer by being fired) is formed by the screen printing or the like in order to be opposed to the first insulating sheet 10A (such that the opposed surfaces of the first insulating sheet 10A and the second insulating sheet 10B have the same area) and to cover the second internal electrodes 36B.

Note that as shown in FIG. 12 and FIG. 13, a space 4 may be formed in a part between the opposed parts of the first and second insulating sheets 10A and 10B, other than parts where the first internal electrode 36A, the mixed-raw-material sheet 2 and the second internal electrode 36B are formed.

Next, as shown in FIG. 12(e) i) and ii), two kinds of through holes 14 are formed by using the known penetrating means, such as laser machining. One of them is the through hole 14 that penetrates the first insulating layer sheet 10A, the first internal electrode 36A, the mixed-raw-material sheet 2 and the second insulating sheet 10B. The other of them is the through hole 14 that penetrates the first insulating sheet 10A, the mixed-raw-material sheet 2, the second internal electrode 36B and the second insulating sheet 10B.

Then, as shown in FIG. 12(f), the penetrating electrode 26 is formed in the penetrating hole 14.

The penetrating electrode 26 can be formed by supplying silver (silver particles) into the through hole, for example, by the screen printing.

Then, after removing the resin sheet 8, the firing is performed. The pressure-contacting may be performed using a pressing device or the like before the firing. The pressure-contacting is preferably performed by heating at 75° C. to 85° C. at a pressing pressure of 50 kgf/cm² or higher. At least part of the space 4 may be crushed during the pressure-contacting (in the crushed part, the mixed-raw-material sheet 2 may exist).

The firing is performed at a temperature of 850° C. to 950° C. This can prevent the damage to the penetrating electrode 26, the first internal electrode 36A and the second internal electrode 36B made of, for example, silver or the like.

As shown in FIG. 13(g) i), after the firing, the first surface electrodes 6A are formed at the lower surface of the first insulating layer 10A, and the second surface electrodes 6B are formed at the upper surface of the second insulating layer 10B. The first surface electrodes 6A and the second surface electrodes 6B may be, for example, plating electrode pads.

In this way, the multilayer substrate 400 can be obtained.

As mentioned above in the chapter of the "multilayer substrate (modification of the basic structure of the multilayer substrate incorporating therein a varistor)", also in this case, the production method can also be used which involves independently forming the respective sheets and laminating them on each other sequentially.

Also in FIG. 8(g) ii), which is an enlarged view of a part enclosed by a dotted line G in FIG. 8(g) i), like the above-mentioned FIG. 10(h) ii), the two group electrodes (left group electrode and right group electrode) are shown. During the normal use, that is, when the high voltage does not occur due to noise or the like, as indicated by a dotted line H, the current entering the first surface electrode 6A of the right group electrode flows through the inside of the semiconductor chip 12 via the second surface electrode 6B in the right group electrode and the electrode 16 of the semiconductor chip. Then, the current enters the left group electrode from another electrode 12 of the semiconductor chip 12 to leave the first surface electrode 6A in the left group electrode. Thus, the current is supplied to the semiconductor chip 12.

However, once the abnormally high voltage (high current) is generated due to noise or the like, the high current entering the first surface electrode 6A of the right group electrode proceeds along the arrow I. That is, the current passing through the right group electrode enters the varistor layer 2 from the second internal electrode 36B of the right group electrode and then enters the left group electrode from the first internal electrode 36A of the left group electrode to leave the first surface electrode 6A of the left group electrode.

As a result, the semiconductor chip 10 hardly allows the current to flow therethrough, thus enabling the protection of the semiconductor chip 12 from the abnormally high voltage.

EXAMPLES

1. Example 1

Original raw materials shown in Table 1 were measured to have the same composition as shown in the table, introduced together with ethanol and zirconia balls in a ball mill casing, and then mixed by the ball mill at 100 rpm for 20 hours. Note that in this example (note that the same goes for Examples 2 to 6), the composition is represented by mol % in terms of a corresponding metal element. That is, Table 1 shows each of the contents of metal elements, including Zn, Bi, Co, Mn and Cr, by mol % that are determined by calculating the mole fractions, taking into consideration only metal atoms bonded to oxygen while not considering oxygen atoms contained in the respective oxides.

All samples (mixed raw materials obtained after being dried) shown in Table 1 were subjected to an ICP (inductively coupled plasma) wet analysis. As a result, each of the contents of antimony (Sb), rare earth element and tin (Sn) was equal to or less than the detection limit (detection limit: 100 ppm by mass ratio). This means that each of the contents of antimony (Sb), rare earth element and tin (Sn) that was obtained by conversion from the mass ratio into molar ratio was less than 0.01 mol %.

TABLE 1

| Sample | Ratio (mol % in terms of metal element) | | | | | | Note |
|---|---|---|---|---|---|---|---|
| | ZnO | $Bi_2O_3$ | $Co_3O_4$ | $Mn_3O_4$ | $Cr_2O_3$ | Others | |
| 1 | Bal. | 1.0 | 0.5 | 0.5 | 0.5 | 0.0 | Example |
| 2 | Bal. | 1.0 | 0.0 | 0.0 | 0.0 | 0.0 | Comparative Example |
| 3 | Bal. | 1.0 | 0.5 | 0.0 | 0.0 | 0.0 | Comparative Example |
| 4 | Bal. | 1.0 | 0.0 | 0.5 | 0.0 | 0.0 | Comparative Example |
| 5 | Bal. | 1.0 | 0.0 | 0.0 | 0.5 | 0.0 | Comparative Example |

After taking out and drying the obtained mixed raw material, it was mixed with ethanol, PVB and plasticizer to fabricate a slurry mixed raw material. At this time, the content rate of PVB in the slurry was set at 10 volume %.

The slurry mixed raw material was used to obtain the varistor laminated body by the method shown in FIG. 1.

Specifically, the slurry raw material was applied onto a PET film 8 in a thickness of 0.07 mm and then dried to produce the mixed-raw-material sheet 2.

Likewise, silver (Ag) powder was mixed with ethanol, PVB (polyvinyl butyral) and a plasticizer to fabricate a slurry. The slurry was applied onto a PET film in a thickness of 0.08 mm and then dried to produce a silver electrode sheet 6.

After punching the PET film 8 with the slurry applied thereto, the PET film 8 was removed to obtain a disk-like mixed-raw-material sheet 2 (14 mm diameter×0.07 mm thickness). The three mixed-raw-material sheets 2 were laminated on each other to produce the mixed-raw-material sheet laminated body 22.

The silver electrode sheets 6 (6 mm diameter×0.05 mm thickness) were laminated on both sides of the mixed-raw-material sheet laminated body to form electrodes. Then, the laminated body was pressed at 85° C. by paying attention not to cause a short circuit between the electrodes to make the pressure contact of these sheets.

The mixed-raw-material sheet laminated body 22 with the silver electrodes 6 formed on both sides thereof was heated at a temperature increase rate of 200° C./hour and fired at 900° C. for 2 hours, thereby producing the varistor laminated body 22.

To the mixed raw material in each sample, 1% by mass of PVA was added and mixed together to be granulated into powder. The granulated powder was formed by pressing at 1 Ton/cm$^2$ and heated at a temperature increase rate of 200° C./hour, and then fired at 900° C. for two hours. Regarding sample 1. the press-formed body was polished to a thickness of 0.2 mm, and then the electrodes with a diameter of 6 mm were burned to both sides of the formed body.

The above-mentioned press-formed body was mirror-polished and then observed with a microscope, whereby the press-formed body was found to be densified. The results of the measurement of respective crystal grain sizes (grain sizes) are shown in FIG. 14.

The grain size was measured and determined by the intercept method. More specifically, the polished surface of the sintered body was subjected to thermal etching at 840° C., which was lower than the sintering temperature, making the grain boundaries clear, followed by taking micrographs through a microscope at 1,000× magnification. Three straight lines of 100 μm in length were drawn on the micrograph. Then, the number of grain boundaries intersecting each straight line was counted. The length (100 μm) of the straight line was divided by the counted number of intersecting grain boundaries to thereby determine a grain size value. Then, an average of the grain size values on the three straight lines was determined as the grain size. In FIG. 14, the mark ● indicates a grain size (average of three grain size values mentioned above); the upper end of a longitudinal bar in contact with the mark ● indicates the maximum value of the three grain size values; and the lower end thereof indicates the minimum value of the three grain size values. That is, the length of the longitudinal bar indicates a variation in the grain size.)

Figure 14:
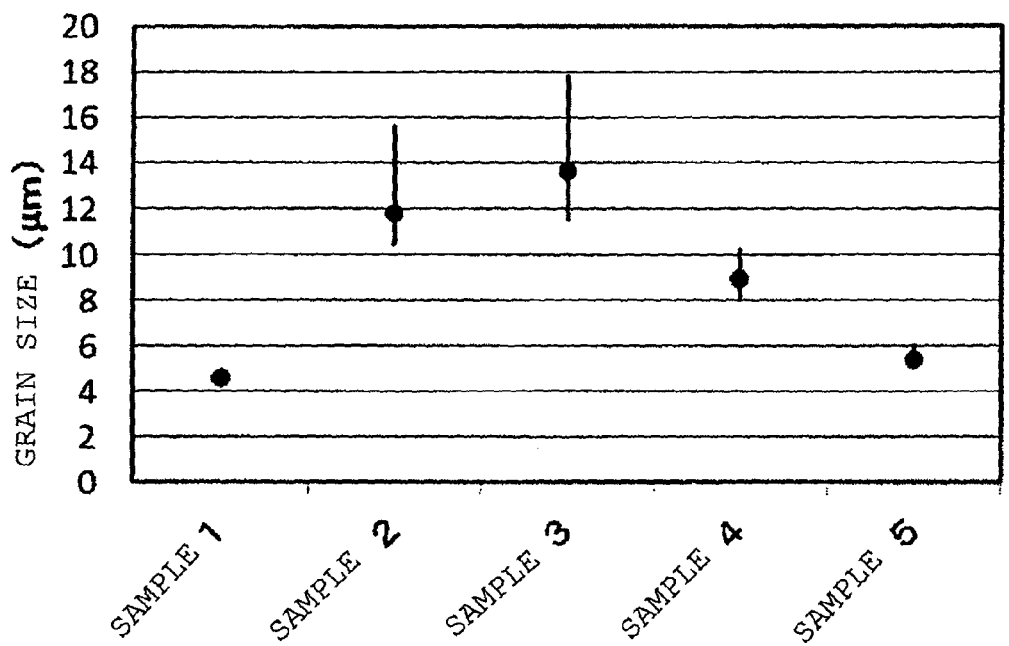
FIG. 14 is a graph showing the results of measurement of grain sizes.

As can be seen from FIG. 14, sample 1 in Example has the smallest grain size with the grain sizes therein uniformized.

Figure 15:
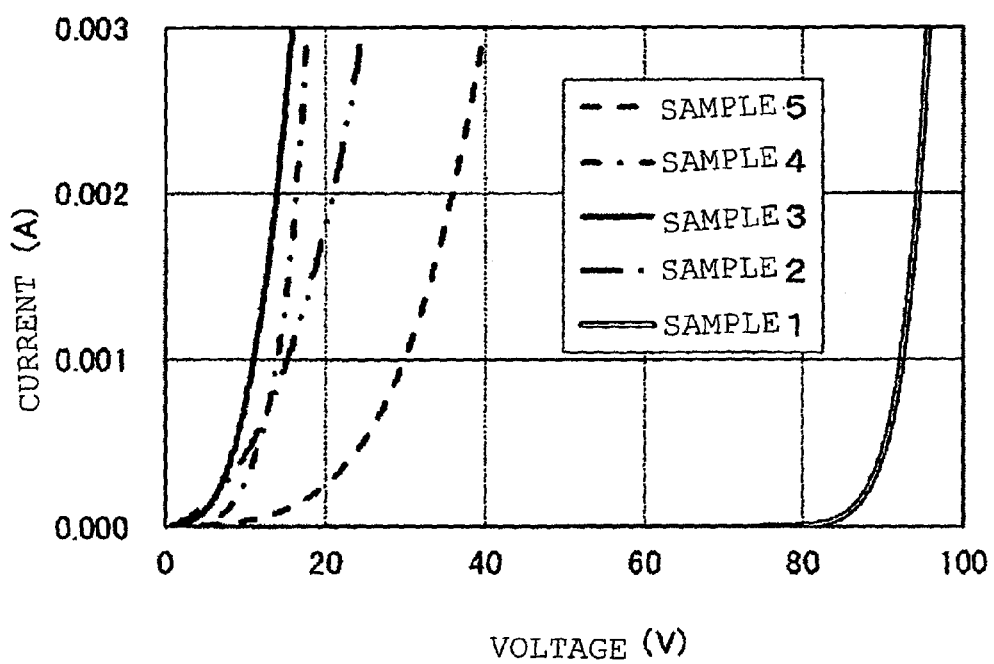
FIG. 15 is a graph showing the result of measurement of a current flowing between electrodes while sweeping a voltage.

As to each of samples 1 to 5 of the varistor laminated bodies 22, a current flowing between the electrodes was measured by an insulation resistance meter R8340 manufactured by ADVANTEST Corporation while sweeping a voltage. The results of the measurements are shown in FIG. 15. From the results of the measurements, the varistor characteristics (insulation resistance, nonlinear constant, varistor voltage) were determined. Although not shown in FIG. 15 and Table 2. sample 1 of the press-formed body exhibited substantially the same varistor characteristics as those of sample 1 of the varistor laminated body 22.

The insulation resistance was set to a resistance value at one tenth of the varistor voltage. The nonlinear constant was determined by the above-mentioned formula (1).

The results are shown in Table 2.

TABLE 2

| Sample | Insulation resistance value (Ω cm) | Nonlinear constant | Varistor voltage (V) |
|---|---|---|---|
| 1 | $4.7 \times 10^{10}$ | 24.6 | 93.0 |
| 2 | $2.0 \times 10^5$ | 2.0 | 15.1 |
| 3 | $2.8 \times 10^5$ | 2.8 | 10.9 |
| 4 | $1.5 \times 10^7$ | 3.8 | 13.9 |
| 5 | $6.7 \times 10^5$ | 3.6 | 29.8 |

As can be seen from Table 2, sample 1 of Example according to the present invention was remarkably superior to samples 2 to 5 as Comparative Examples in all the insulation resistance, nonlinear constant and varistor voltage.

2. Example 2

Original raw materials shown in Table 3 were measured to have the same composition as shown in the table, introduced together with ethanol and zirconia balls in a ball mill casing, and then mixed by the ball mill at 100 rpm for 20 hours.

All samples (mixed raw materials obtained after being dried) shown in Table 3 were subjected to the ICP (inductively coupled plasma) wet analysis. As a result, each of the contents of antimony (Sb), rare earth element and tin (Sn) was equal to or less than the detection limit (detection limit: 100 ppm by mass ratio). This means that each of the contents of antimony (Sb), rare earth element and tin (Sn) that was obtained by conversion from the mass ratio into molar ratio was less than 0.01 mol %.

After taking out and drying the obtained mixed raw material, the dried mixed raw material (mixed dried powder) was mixed with a vehicle including ethyl cellulose and an organic solvent such as aromatic hydrocarbon by means of a triple roll mill to obtain a slurry for screen printing. In mixing, the dried mixed raw material and the vehicle were measured such that a mixing ratio of the dried mixed raw material to the vehicle was set at the ratio of 63% by mass of the mixed raw material to 37% by mass of the vehicle. The used vehicle was TMC-108-K produced by TANAKA KIKINZOKU KOGYO K.K. Specifically, it contained 5 to 15% by mass of the ethyl cellulose and 95 to 85% by mass of an organic solvent, such as aromatic hydrocarbon.

The respective original materials shown in Table 3 were measured to have the composition shown in this table, and then used to thereby produce a mixed-raw-material sheet of 0.08 mm in thickness by the same fabricating method as that of the mixed-raw-material sheet 2 shown in Example 1. The mixed-raw-material sheet was cut into a size of approximately 20 mm×40 mm, thereby producing a mixed-raw-material sheet 2A shown in FIG. 16(a).

Figure 16:
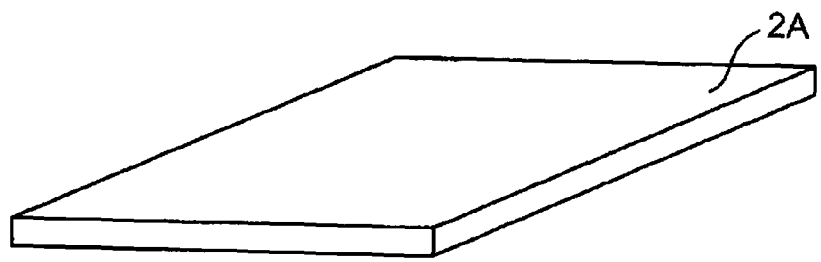
FIGS. 16(a) to 16(d) are perspective views showing a method for producing a multilayer substrate 500.
Figure 16:
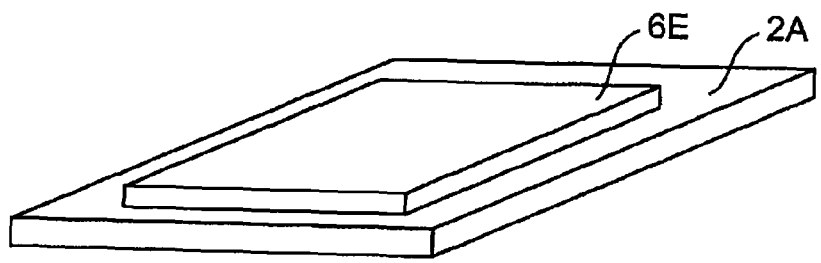
Figure 16:
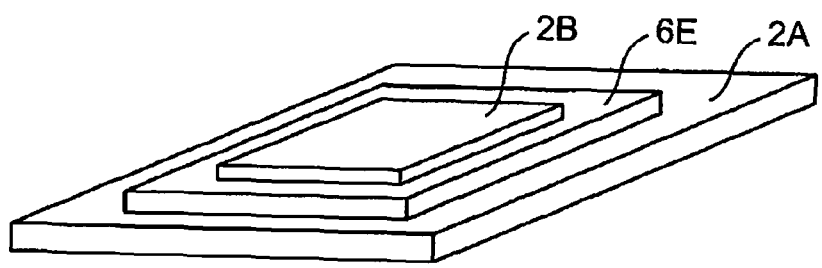
Figure 16:
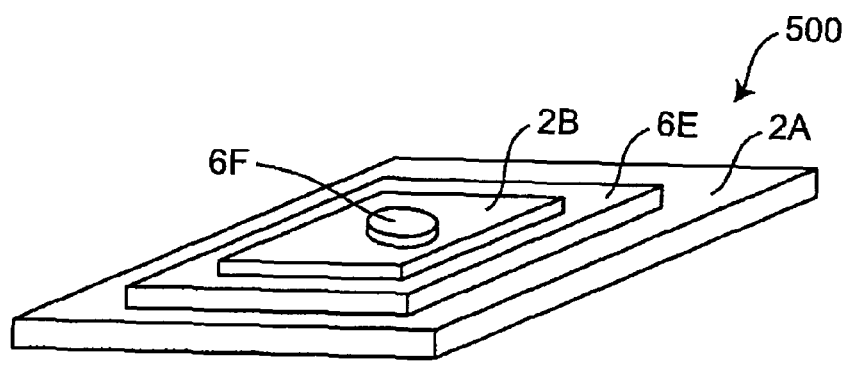

As shown in FIG. 16(b), the silver electrode paste was screen-printed on the mixed-raw-material sheet, whereby a first electrode paste layer 6E of 18 mm×30 mm was formed on the mixed-raw-material sheet 2A not to spread out of the main surface of the mixed-raw-material sheet 2A.

Next, as shown in FIG. 16(c), the above-mentioned slurry for the screen printing (the material having the same composition as that of the respective original raw materials used to form the mixed-raw-material sheet 2A) was applied by the screen printing in a region of 13 mm×25 mm on the first electrode paste layer 6E. Then, the applied slurry was dried to thereby obtain a varistor slurry layer 2B.

Then, a silver electrode paste was screen-printed on the varistor slurry layer 2B not to spread out of the main surface of the varistor slurry layer 2B, whereby a second electrode paste layer 6F of 6 mm in diameter was provided.

The thickness of the first electrode paste layer 6E and the thickness of the second electrode paste layer 6F were set to achieve the first electrode layer 6E and the second electrode layer 6F having a thickness of 10 μm after the sintering. The varistor slurry layer 2B was overpainted until the thickness of the varistor layer 2B after the sintering reached 200 μm. The drying of the varistor slurry layer 2B, the first electrode paste layer 6E and the second electrode paste layer 6F was performed at a temperature of 60° C. or higher.

The obtained laminated body was heated at a temperature increase rate of 200° C./hour and fired at 900° C. for two hours, which produced a multilayer substrate 500 including the first varistor layer 2A, first electrode layer 6E, second varistor layer 2B and second electrode layer 6F.

Note that the mixed-raw-material sheet 2A is a dummy sheet used to hold the shapes of the first electrode layer 6E, the second varistor layer and the second electrode layer 6F. The use of the varistor layer as the dummy sheet can more surely prevent the change of the composition of the second varistor layer 2B due to the diffusion in the firing, which would otherwise fail to obtain the desired characteristics. Thus, the characteristics of the second varistor layer can be measured more accurately.

The varistor characteristics of the varistor layer 2B were measured on samples 2-1 to 2-60 of the obtained multilayer substrate 500 by the same method as that in Example 1. Note that the voltage (varistor voltage) applied during measuring the varistor characteristics was divided by the thickness of the second varistor layer 2B to define the thus-obtained standardized value as the varistor voltage. The current used was determined by dividing a measured current value (A) by an electrode area ($cm^2$).

The electrodes used for measuring the varistor characteristics were counter electrodes composed of the electrode layer 6C and the electrode layer 6D. The measurement results are shown in Table 4.

As can be seen from Table 4, also in use of the raw material having the composition shown in Table 3, the samples of Examples in the present invention are superior in all the insulation resistance, nonlinear constant and varistor voltage.

TABLE 3

| Sample | Ratio (mol % in terms of metal element) | | | | | | Firing temperature | Note |
|---|---|---|---|---|---|---|---|---|
|  | ZnO | $Bi_2O_3$ | $Co_3O_4$ | $Mn_3O_4$ | $Cr_2O_3$ | Others |  |  |
| 2-1 | Bal. | 1.0 | 0.02 | 0.02 | 0.02 | 0.0 | 850 | Comparative Example |
| 2-2 | Bal. | 1.0 | 0.2 | 0.5 | 0.5 | 0.0 | 850 | Example |
| 2-3 | Bal. | 1.0 | 0.5 | 0.5 | 0.5 | 0.0 | 850 | Example |
| 2-4 | Bal. | 1.0 | 1.0 | 0.5 | 0.5 | 0.0 | 850 | Example |
| 2-5 | Bal. | 1.0 | 1.4 | 0.5 | 0.5 | 0.0 | 850 | Example |
| 2-6 | Bal. | 1.0 | 0.5 | 0.5 | 0.1 | 0.0 | 850 | Example |
| 2-3 | Bal. | 1.0 | 0.5 | 0.5 | 0.5 | 0.0 | 850 | Example |
| 2-7 | Bal. | 1.0 | 0.5 | 0.5 | 1.0 | 0.0 | 850 | Example |
| 2-8 | Bal. | 1.0 | 0.5 | 0.5 | 1.5 | 0.0 | 850 | Example |
| 2-9 | Bal. | 1.0 | 0.5 | 0.1 | 0.5 | 0.0 | 850 | Example |
| 2-3 | Bal. | 1.0 | 0.5 | 0.5 | 0.5 | 0.0 | 850 | Example |
| 2-10 | Bal. | 1.0 | 0.5 | 1.0 | 0.5 | 0.0 | 850 | Example |
| 2-11 | Bal. | 1.0 | 0.5 | 1.5 | 0.5 | 0.0 | 850 | Example |
| 2-12 | Bal. | 1.0 | 1.4 | 1.5 | 1.5 | 0.0 | 850 | Example |
| 2-13 | Bal. | 1.0 | 2.5 | 2.5 | 2.5 | 0.0 | 850 | Comparative Example |
| 2-14 | Bal. | 0.3 | 0.5 | 0.5 | 0.5 | 0.0 | 900 | Comparative Example |
| 2-15 | Bal. | 0.6 | 0.5 | 0.5 | 0.5 | 0.0 | 900 | Example |
| 2-16 | Bal. | 1.0 | 0.5 | 0.5 | 0.5 | 0.0 | 900 | Example |
| 2-17 | Bal. | 2.0 | 0.5 | 0.5 | 0.5 | 0.0 | 900 | Example |
| 2-18 | Bal. | 2.5 | 0.5 | 0.5 | 0.5 | 0.0 | 900 | Example |
| 2-19 | Bal. | 3.0 | 0.5 | 0.5 | 0.5 | 0.0 | 900 | Example |
| 2-20 | Bal. | 4.0 | 0.5 | 0.5 | 0.5 | 0.0 | 900 | Comparative Example |
| 2-21 | Bal. | 0.6 | 0.5 | 0.1 | 0.1 | 0.0 | 850 | Example |
| 2-22 | Bal. | 0.6 | 1.0 | 0.1 | 0.5 | 0.0 | 850 | Example |
| 2-23 | Bal. | 0.6 | 0.2 | 0.5 | 1.0 | 0.0 | 850 | Example |
| 2-24 | Bal. | 0.6 | 1.0 | 0.5 | 1.0 | 0.0 | 850 | Example |
| 2-25 | Bal. | 0.6 | 0.2 | 1.0 | 0.5 | 0.0 | 850 | Example |
| 2-26 | Bal. | 0.6 | 0.5 | 1.0 | 1.0 | 0.0 | 850 | Example |
| 2-27 | Bal. | 1.0 | 0.2 | 0.5 | 0.1 | 0.0 | 850 | Example |
| 2-28 | Bal. | 1.0 | 1.0 | 0.5 | 0.1 | 0.0 | 850 | Example |
| 2-29 | Bal. | 0.6 | 1.0 | 0.1 | 0.5 | 0.0 | 900 | Example |
| 2-30 | Bal. | 0.6 | 0.2 | 0.5 | 0.1 | 0.0 | 900 | Example |
| 2-31 | Bal. | 0.6 | 0.2 | 0.5 | 1.0 | 0.0 | 900 | Example |
| 2-32 | Bal. | 0.6 | 0.5 | 1.0 | 0.1 | 0.0 | 900 | Example |
| 2-33 | Bal. | 0.6 | 0.5 | 1.0 | 1.0 | 0.0 | 900 | Example |
| 2-34 | Bal. | 1.0 | 0.2 | 0.1 | 0.5 | 0.0 | 900 | Example |
| 2-35 | Bal. | 1.0 | 0.5 | 0.5 | 0.5 | 0.0 | 900 | Example |
| 2-36 | Bal. | 1.0 | 1.0 | 0.5 | 0.1 | 0.0 | 900 | Example |
| 2-37 | Bal. | 1.0 | 0.2 | 1.0 | 0.5 | 0.0 | 900 | Example |
| 2-38 | Bal. | 0.6 | 0.5 | 0.1 | 0.1 | 0.0 | 950 | Example |
| 2-39 | Bal. | 0.6 | 0.5 | 0.1 | 0.5 | 0.0 | 950 | Example |

TABLE 3-continued

| Sample | Ratio (mol % in terms of metal element) | | | | | | Firing temperature | Note |
|---|---|---|---|---|---|---|---|---|
| | ZnO | Bi$_2$O$_3$ | Co$_3$O$_4$ | Mn$_3$O$_4$ | Cr$_2$O$_3$ | Others | | |
| 2-40 | Bal. | 0.6 | 1.0 | 0.1 | 0.5 | 0.0 | 950 | Example |
| 2-41 | Bal. | 0.6 | 0.2 | 0.5 | 1.0 | 0.0 | 950 | Example |
| 2-42 | Bal. | 0.6 | 0.2 | 1.0 | 0.5 | 0.0 | 950 | Example |
| 2-43 | Bal. | 0.6 | 0.2 | 1.0 | 1.0 | 0.0 | 950 | Example |
| 2-44 | Bal. | 0.6 | 0.5 | 1.0 | 1.0 | 0.0 | 950 | Example |
| 2-45 | Bal. | 1.0 | 0.2 | 0.1 | 0.5 | 0.0 | 950 | Example |
| 2-46 | Bal. | 1.0 | 0.5 | 0.5 | 0.5 | 0.0 | 950 | Example |
| 2-47 | Bal. | 2.0 | 0.2 | 0.1 | 0.5 | 0.0 | 900 | Example |
| 2-48 | Bal. | 2.0 | 0.2 | 0.5 | 1.0 | 0.0 | 900 | Example |
| 2-49 | Bal. | 2.0 | 0.5 | 0.5 | 1.0 | 0.0 | 900 | Example |
| 2-50 | Bal. | 2.0 | 1.0 | 0.5 | 1.0 | 0.0 | 900 | Example |
| 2-51 | Bal. | 2.0 | 0.2 | 1.0 | 1.0 | 0.0 | 900 | Example |
| 2-52 | Bal. | 2.0 | 1.0 | 1.0 | 0.5 | 0.0 | 900 | Example |
| 2-53 | Bal. | 1.0 | 1.4 | 0.5 | 0.5 | 0.0 | 900 | Example |
| 2-54 | Bal. | 1.0 | 1.4 | 0.1 | 1.0 | 0.0 | 900 | Example |
| 2-55 | Bal. | 1.0 | 0.5 | 0.5 | 1.5 | 0.0 | 900 | Example |
| 2-56 | Bal. | 2.0 | 0.2 | 0.5 | 1.5 | 0.0 | 900 | Example |
| 2-57 | Bal. | 1.0 | 0.5 | 1.5 | 0.5 | 0.0 | 900 | Example |
| 2-58 | Bal. | 0.6 | 0.2 | 1.5 | 0.5 | 0.0 | 900 | Example |
| 2-59 | Bal. | 2.5 | 0.5 | 0.5 | 0.5 | 0.0 | 900 | Example |
| 2-60 | Bal. | 2.5 | 0.2 | 0.5 | 1.0 | 0.0 | 900 | Example |

TABLE 4

| Sample | Insulation resistance value | Nonlinear constant | Varistor voltage |
|---|---|---|---|
| 2-1 | 1 × 10$^{10}$ | 9 | 510 |
| 2-2 | 3 × 10$^{11}$ | 22 | 750 |
| 2-3 | 2 × 10$^{11}$ | 42 | 730 |
| 2-4 | 1 × 10$^{11}$ | 24 | 690 |
| 2-5 | 1 × 10$^{11}$ | 21 | 690 |
| 2-6 | 2 × 10$^{10}$ | 20 | 450 |
| 2-3 | 2 × 10$^{11}$ | 42 | 730 |
| 2-7 | 8 × 10$^{10}$ | 27 | 800 |
| 2-8 | 3 × 10$^{10}$ | 24 | 580 |
| 2-9 | 2 × 10$^{10}$ | 22 | 620 |
| 2-3 | 2 × 10$^{11}$ | 42 | 730 |
| 2-10 | 2 × 10$^{12}$ | 27 | 930 |
| 2-11 | 7 × 10$^{10}$ | 26 | 510 |
| 2-12 | 1 × 10$^{11}$ | 25 | 1,100 |
| 2-13 | 8 × 10$^{9}$ | 4 | 1,600 |
| 2-14 | 6 × 10$^{9}$ | 9 | 180 |
| 2-15 | 2 × 10$^{11}$ | 35 | 670 |
| 2-16 | 2 × 10$^{11}$ | 34 | 530 |
| 2-17 | 2 × 10$^{10}$ | 26 | 920 |
| 2-18 | 4 × 10$^{10}$ | 22 | 130 |
| 2-19 | 2 × 10$^{10}$ | 20 | 190 |
| 2-20 | 2 × 10$^{9}$ | 15 | 110 |
| 2-21 | 3 × 10$^{9}$ | 20 | 440 |
| 2-22 | 6 × 10$^{11}$ | 36 | 610 |
| 2-23 | 5 × 10$^{10}$ | 25 | 960 |
| 2-24 | 8 × 10$^{10}$ | 28 | 910 |
| 2-25 | 4 × 10$^{10}$ | 27 | 750 |
| 2-26 | 8 × 10$^{10}$ | 30 | 1,030 |
| 2-27 | 1 × 10$^{10}$ | 25 | 470 |
| 2-28 | 2 × 10$^{10}$ | 20 | 420 |
| 2-29 | 2 × 10$^{11}$ | 29 | 400 |
| 2-30 | 8 × 10$^{10}$ | 25 | 370 |
| 2-31 | 4 × 10$^{10}$ | 25 | 710 |
| 2-32 | 1 × 10$^{11}$ | 26 | 710 |
| 2-33 | 4 × 10$^{10}$ | 28 | 740 |
| 2-34 | 6 × 10$^{9}$ | 23 | 370 |
| 2-35 | 8 × 10$^{10}$ | 34 | 530 |
| 2-36 | 5 × 10$^{9}$ | 16 | 150 |
| 2-37 | 6 × 10$^{10}$ | 24 | 630 |
| 2-38 | 5 × 10$^{9}$ | 20 | 170 |
| 2-39 | 7 × 10$^{10}$ | 20 | 320 |
| 2-40 | 2 × 10$^{11}$ | 23 | 330 |
| 2-41 | 2 × 10$^{10}$ | 22 | 480 |
| 2-42 | 1 × 10$^{10}$ | 23 | 350 |
| 2-43 | 3 × 10$^{10}$ | 22 | 610 |
| 2-44 | 3 × 10$^{10}$ | 27 | 560 |
| 2-45 | 3 × 10$^{9}$ | 21 | 230 |
| 2-46 | 2 × 10$^{9}$ | 18 | 260 |
| 2-47 | 3 × 10$^{9}$ | 20 | 250 |
| 2-48 | 7 × 10$^{9}$ | 16 | 410 |
| 2-49 | 8 × 10$^{10}$ | 23 | 560 |
| 2-50 | 1 × 10$^{11}$ | 23 | 640 |
| 2-51 | 1 × 10$^{11}$ | 26 | 720 |
| 2-52 | 2 × 10$^{10}$ | 21 | 410 |
| 2-53 | 1 × 10$^{11}$ | 21 | 690 |
| 2-54 | 3 × 10$^{10}$ | 17 | 580 |
| 2-55 | 3 × 10$^{10}$ | 24 | 560 |
| 2-56 | 8 × 10$^{10}$ | 17 | 560 |
| 2-57 | 7 × 10$^{10}$ | 26 | 510 |
| 2-58 | 2 × 10$^{10}$ | 17 | 510 |
| 2-59 | 4 × 10$^{10}$ | 19 | 130 |
| 2-60 | 2 × 10$^{10}$ | 19 | 510 |

3. Example 3

The respective original raw materials shown in Table 5 were measured to have the composition shown in this table, and then used to thereby produce a varistor laminated body 22 (samples 6 to 8) with the electrodes 6 formed on both ends thereof by the same method as that of Example 1.

Note that all samples shown in Table 5 (mixed raw materials obtained after drying) were subjected to the ICP (inductively coupled plasma) wet analysis in the same way as in Example 1. As a result, each of the contents of antimony (Sb), rare earth element and tin (Sn) was equal to or less than the detection limit (detection limit: 100 ppm by mass ratio). This means that each of the contents of antimony (Sb), rare earth element and tin (Sn) that was obtained by conversion from the mass ratio into molar ratio was less than 0.01 mol %.

TABLE 5

| Sample | Ratio (mol % in terms of metal element) | | | | | | Note |
|---|---|---|---|---|---|---|---|
| | ZnO | $Bi_2O_3$ | $Co_3O_4$ | $Mn_3O_4$ | $Cr_2O_3$ | Others | |
| 6 | Bal. | 1.0 | 0.5 | 0.5 | 0.5 | $B_2O_3$ 0.5 | Example |
| 7 | Bal. | 1.0 | 0.5 | 0.5 | 0.5 | $Sc_2O_3$ 0.5 | Example |
| 8 | Bal. | 1.0 | 0.5 | 0.5 | 0.5 | $Ba_2O$ 0.5 | Example |

The varistor characteristics of the varistor laminated body 22 in each of the samples were measured by the same method as that in Example 1. The measurement results are shown in Table 6.

TABLE 6

| Sample | Insulation resistance value (Ω cm) | Nonlinear constant | Varistor voltage (V) |
|---|---|---|---|
| 6 | $1.2 \times 10^{11}$ | 26.2 | 110 |
| 7 | $1.6 \times 10^{10}$ | 33.6 | 192 |
| 8 | $2.4 \times 10^{10}$ | 20.1 | 117 |

Table 6 shows that samples 6 to 8 can control their varistor voltages in a wide range by changing the kind or amount of each additive and can attain the excellent insulation resistance and nonlinear constant as well as the high-level varistor characteristics.

4. Example 4

The respective original raw materials shown in Table 7 were measured to have the composition shown in this table, and then used to thereby produce a multilayer substrate 500 by the same method as that of Example 2.

All samples (mixed raw materials obtained after being dried) shown in Table 7 were subjected to the ICP (inductively coupled plasma) wet analysis. As a result, each of the contents of antimony (Sb), rare earth element and tin (Sn) was equal to or less than the detection limit (detection limit: 100 ppm by mass ratio). This means that each of the contents of antimony (Sb), rare earth element and tin (Sn) that was obtained by conversion from the mass ratio into molar ratio was less than 0.01 mol %.

The varistor characteristics of the varistor layer 2B were measured on samples 4-1 to 4-14 of the obtained multilayer substrate 500 by the same method as that in Example 1. Note that the voltage (varistor voltage) applied during measuring the varistor characteristics was divided by the thickness of the varistor laminated body to define the thus-obtained standardized value as the varistor voltage. The current used was determined by dividing a measured current value (A) by an electrode area (cm²).

The electrodes used for measuring the varistor characteristics were counter electrodes composed of the electrode layer 6C and the electrode layer 6D. The measurement results are shown in Table 8.

As can be seen from Table 8, also in use of the raw material having the composition shown in Table 7, the samples of Examples in the present invention are superior in all the insulation resistance, nonlinear constant and varistor voltage.

TABLE 7

| Sample | Ratio (mol % in terms of metal element) | | | | | | Firing temperature | Note |
|---|---|---|---|---|---|---|---|---|
| | ZnO | $Bi_2O_3$ | $Co_3O_4$ | $Mn_3O_4$ | $Cr_2O_3$ | | | |
| | | | | | | $B_2O_3$ | | |
| 4-1 | Bal. | 1.0 | 0.5 | 0.5 | 0.5 | 0.0 | 900 | Example |
| 4-2 | Bal. | 1.0 | 0.5 | 0.5 | 0.5 | 0.3 | 900 | Example |
| 4-3 | Bal. | 1.0 | 0.5 | 0.5 | 0.5 | 0.5 | 900 | Example |
| 4-4 | Bal. | 1.0 | 0.5 | 0.5 | 0.5 | 1.0 | 900 | Example |
| 4-5 | Bal. | 1.0 | 0.5 | 0.5 | 0.5 | 2.0 | 900 | Example |
| 4-6 | Bal. | 1.0 | 0.5 | 0.5 | 0.5 | 3.0 | 900 | Example |
| 4-7 | Bal. | 1.0 | 0.5 | 0.5 | 0.5 | 4.0 | 900 | Example |
| 4-8 | Bal. | 1.0 | 0.5 | 0.5 | 0.5 | 5.0 | 900 | Example |
| | | | | | | $Sc_2O_3$ | | |
| 4-9 | Bal. | 1.0 | 0.5 | 0.5 | 0.5 | 0.0 | 900 | Example |
| 4-10 | Bal. | 1.0 | 0.5 | 0.5 | 0.5 | 0.3 | 900 | Example |
| 4-11 | Bal. | 1.0 | 0.5 | 0.5 | 0.5 | 0.4 | 900 | Example |
| 4-12 | Bal. | 1.0 | 0.5 | 0.5 | 0.5 | 0.5 | 900 | Example |
| 4-13 | Bal. | 1.0 | 0.5 | 0.5 | 0.5 | 0.7 | 900 | Example |
| 4-14 | Bal. | 1.0 | 0.5 | 0.5 | 0.5 | 0.8 | 900 | Example |

TABLE 8

| Sample | Insulation resistance value | Nonlinear constant | Varistor voltage |
|---|---|---|---|
| 4-1 | $6.3 \times 10^{10}$ | 34 | 499 |
| 4-2 | $5.1 \times 10^{11}$ | 35 | 426 |
| 4-3 | $2.1 \times 10^{11}$ | 36 | 362 |
| 4-4 | $8.3 \times 10^{11}$ | 41 | 344 |
| 4-5 | $3.5 \times 10^{11}$ | 41 | 241 |
| 4-6 | $3.6 \times 10^{11}$ | 45 | 250 |
| 4-7 | $4.0 \times 10^{11}$ | 35 | 280 |
| 4-8 | $8.6 \times 10^{11}$ | 31 | 316 |
| 4-9 | $6.3 \times 10^{10}$ | 34 | 499 |
| 4-10 | $8.7 \times 10^{10}$ | 30 | 659 |
| 4-11 | $4.3 \times 10^{11}$ | 35 | 787 |

TABLE 8-continued

| Sample | Insulation resistance value | Nonlinear constant | Varistor voltage |
|---|---|---|---|
| 4-12 | $6.3 \times 10^{11}$ | 50 | 995 |
| 4-13 | $4.0 \times 10^{10}$ | 36 | 910 |
| 4-14 | $1.1 \times 10^{11}$ | 24 | 895 |

5. Example 5

Figure 17:
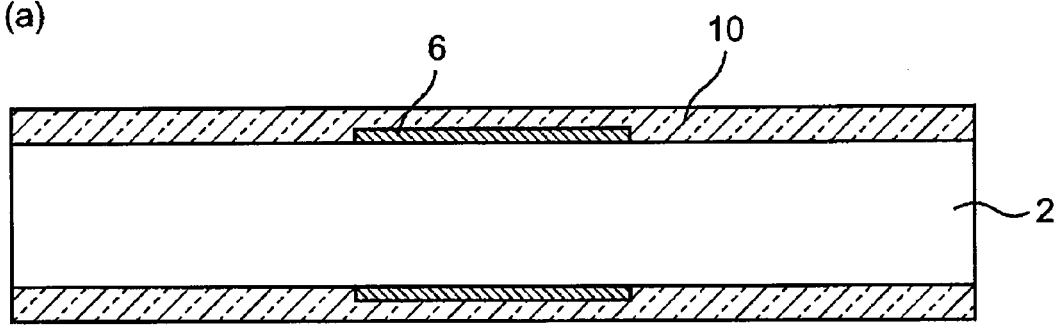
FIG. 17(a) is a cross-sectional view of sample 9 in Example 5.
FIG. 17(b) is a cross-sectional view of sample 10 in Example 5.
Figure 17:
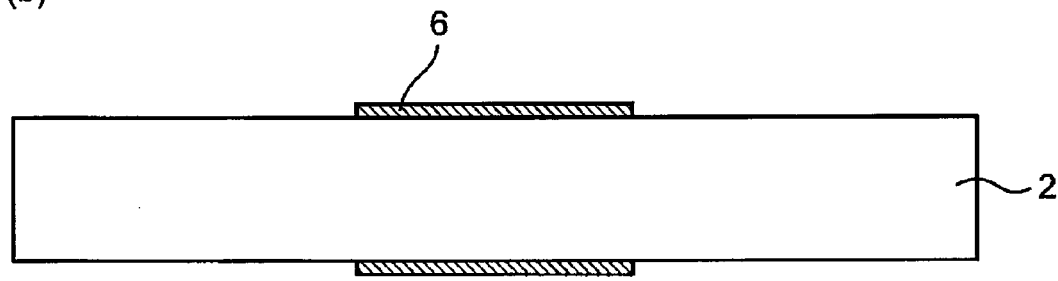

FIG. 17(a) is a cross-sectional view of sample 9 in Example 5, and FIG. 17(b) is a cross-sectional view of sample 10 in Example 5.

Sample 9 is a sample of Examples (multilayer substrate) having the varistor layer 2 integrally formed with the electrodes 6 within a multilayer substrate (more specifically, between two insulating layers 10). On the other hand, sample 10 is a sample as an example fabricated for comparison with sample 9 in the characteristics, and has no insulating layer 10.

The same mixed raw material as that of sample 1 shown in Table 1 was obtained using the same method and original raw materials as those mentioned in Example 1.

The mixed raw material (obtained after being dried) were subjected to the ICP (inductively coupled plasma) wet analysis. As a result, each of the contents of antimony (Sb), rare earth element and tin (Sn) was equal to or less than the detection limit (detection limit: 100 ppm by mass ratio). This means that each of the contents of antimony (Sb), rare earth element and tin (Sn) that was obtained by conversion from the mass ratio into molar ratio was less than 0.01 mol %.

The obtained mixed raw material was used to thereby produce a disk-shaped mixed raw material sheet 2 with 14 mm diameter×0.2 mm thickness by the same method as that in Example 1.

As insulating material for the insulating layer 10, LTCC material "DN1B" manufactured by Hitachi Metals, Ltd., was used (see "Manufacturing Processes of Ceramics for Electronics and Applied Technology <Complete Collection>, published by Technical Information Institute Co. Ltd., 2007, p633). The "DN1B" contained, as main components, alkaline-earth oxide, $SiO_2$ and $Al_2O_3$.

The insulating material was mixed with ethanol, PVB and a plasticizer to thereby fabricate a slurry mixed raw material for the insulating layer. At this time, the content rate of PVB in the slurry was set at 10 volume %.

The slurry mixed raw material for the insulating layer was applied onto the PET film and dried out, producing an insulating sheet 10 with 14 mm diameter×0.05 mm thickness.

Further, the silver electrode sheet 6 with 5 mm×5 mm×0.02 mm thickness was obtained by the same method as that in Example 1.

The thus-obtained mixed-raw-material sheet 2, the insulating sheets 10 and the silver electrode sheets 6 were laminated in the manner as shown in FIG. 17(a). That is, on each of two main surfaces of the mixed-raw-material sheet 2, the silver electrode sheet 6 covering part of the mixed-raw-material sheet 2, and the insulating sheet 10 covering the silver electrode sheet 6 and the mixed-raw-material sheet 2 were laminated to produce the laminated body.

Then, the laminated body was pressed at 85° C. to perform pressure-contacting between the respective layers. The laminated body subjected to the pressure-contacting was heated at a temperature increase rate of 200° C./hour and fired at 900° C. for 2 hours, thus obtaining sample 9 which was the multilayer substrate (LTCC integrated varistor laminated body).

Note that to enable the measurement of its varistor characteristics, in sample 9, two insulating layers 10 of the sample 9 have through holes, and penetrating electrodes (not shown in FIG. 17(a)) disposed in the through holes and electrically connected to the electrodes 6.

To obtain sample 10. as shown in FIG. 17(b), the mixed-raw-material sheet 2 and the silver electrode sheets 6 were laminated. That is, on two respective main surfaces of the mixed-raw-material sheet 2, the silver electrode sheets 6 covering parts of the mixed-raw-material sheet 2 were disposed to produce the laminated body. Then, the pressure-contacting and firing were performed under the same conditions as those for sample 9 to thereby produce sample (varistor laminated body) 10.

Next, regarding both samples 9 and 10. their varistor characteristics were measured by the same method as that in Example 1.

Since there can be a slight difference in thickness of the actually-obtained varistor layer 2 between samples 9 and 10, the cross-sections of the samples 9 and 10 after measuring the varistor characteristics were observed to thereby measure the thickness of each varistor layer 2 (which was the same as the distance between two electrodes 6).

Then, the voltage (varistor voltage) applied during measuring the varistor characteristics was divided by the thickness of the varistor layer 2 to define the thus-obtained standardized value as the varistor voltage. The measurement results are shown in Table 9.

TABLE 9

| Sample | Insulation resistance value (Ω cm) | Nonlinear constant | Varistor voltage (V/mm) |
|---|---|---|---|
| 9 | $5.0 \times 10^{10}$ | 10 | 430 |
| 10 | $5.0 \times 10^{10}$ | 24 | 460 |

As can be seen from Table 9, both samples 9 and 10 had the adequate varistor characteristics.

That is, not only sample 10 having no insulating layer 10 on both surfaces of the varistor layer 2, but also sample 9 which was the multilayer substrate (LTCC integrated varistor laminated body) having the insulating layer 10 on both surfaces of the varistor layer 2 had the excellent varistor characteristics.

6. Example 6

(1) Multilayer Substrate 100

Original raw materials shown in Table 10 were measured to have the same composition as shown in the table, introduced together with ethanol and zirconia balls in a ball mill casing, and then mixed by the ball mill at 100 rpm for 20 hours.

All samples (mixed raw materials obtained after being dried) shown in Table 10 were subjected to the ICP (inductively coupled plasma) wet analysis. As a result, each of the contents of antimony (Sb), rare earth element and tin (Sn) was not more than the detection limit (detection limit: 100 ppm by mass ratio). This means that each of the contents of antimony (Sb), rare earth element and tin (Sn) that was obtained by conversion from the mass ratio into molar ratio was less than 0.01 mol %.

After taking out and drying the mixed raw material, the dried mixed raw material (mixed dried powder) was mixed with a vehicle including ethyl cellulose and an organic solvent such as aromatic hydrocarbon by means of a triple roll mill to obtain a slurry for screen printing. In mixing, the dried, mixed raw material and the vehicle were measured such that a mixing ratio of the dried, mixed raw material to the vehicle was set at the ratio of 63% by mass of the mixed raw material to 37% by mass of the vehicle. The used vehicle was TMC-108-K produced by TANAKA KIKINZOKU KOGYO K.K. Specifically, it contains 5 to 15% by mass of ethyl cellulose and 95 to 85% by mass of the organic solvent, such as the aromatic hydrocarbon.

The insulating sheet 10 having a thickness of 0.08 mm fabricated by the same method as that in Example 5 was cut in the size of approximately 20 mm×40 mm. A metal stick of 0.5 mm in diameter was pressed against the cut insulating sheet 10 to form the through hole 14.

A silver electrode paste was charged into the through hole 14 of the insulating sheet 10 and dried out to thereby form the electrode paste layer 6F, which served as the penetrating electrode 6F after the firing.

As shown in FIG. 3(c), the silver electrode paste was applied to the surface of the insulating sheet 10 by the screen printing, and dried at a temperature of 60° C. or higher to thereby form the electrode paste layer 6E with a diameter of 6 mm on the upper surface of the insulating sheet 10 to be in contact with the electrode paste layer 6F, thus producing a laminated body 450. Two laminated bodies 450 of each sample were fabricated. The thickness of the electrode paste layer 6E was adjusted to be 10 μm after the sintering.

In one of the two laminated bodies 450, the main surface of the electrode paste layer 6E was completely covered with the above-mentioned slurry by the screen printing method. Thereafter, the laminated body was dried at a temperature of 60° C. or higher to thereby produce a laminated body 460. In the laminated body 460, the diameter of the varistor slurry layer 2 was set at 14 mm. The slurry was applied (overpainted) a plurality of times by the screen printing such that the thickness of the varistor slurry layer 2 was 0.05 mm after the sintering.

A through hole 14A with a diameter of 14 mm was provided in another insulating sheet 10.

As shown in FIG. 5, the laminated body 160, the insulating sheet 10 with the through hole 14A, and the laminated body 150 were disposed. The laminated bodies 150 and 160 and their respective insulating layers 10 were in contact with (laminated on) the insulating layer 10 with the through hole 14A in the following manner. Specifically, the center of the circle of the electrode paste layer 6E in the laminated body 150 was aligned with the center of the circle of the electrode paste layer 6E in the laminated body 160 with the positional accuracy of 0.5 mm. Further, the electrode paste layer 6E and varistor slurry layer 2 in the laminated body 160 and the electrode paste layer 6E in the laminated body 150 were laminated on each other within the through hole 14A. These layers were pressed at 85° C. to thereby produce a composite laminated body.

The thus-obtained composite laminated body was heated at a temperature increase rate of 200° C./hour and fired at 900° C. for two hours, thereby producing the multilayer substrate 100.

The varistor characteristics of the varistor layer 2 were measured on samples 6-1 to 6-7 of the obtained multilayer substrate 100 by the same method as that in Example 1. Note that the voltage (varistor voltage) applied during measuring the varistor characteristics was divided by the thickness of the varistor layer obtained after the sintering to define the thus-obtained standardized value as the varistor voltage. The current used was determined by dividing a measured current value (A) by an electrode area ($cm^2$).

In measuring the varistor characteristics, the conductive paste is applied to the part of the penetrating electrode 6F exposed from the upper surface of the insulating layer 10A as well as the part of the penetrating electrode 6F exposed from the lower surface of the insulating layer 10C, thereby forming the electrodes as measurement terminals. The measurement results are shown in Table 11.

As can be seen from Table 11, also in use of the raw material having the composition shown in Table 10, the samples of Examples in the present invention are superior in all the insulation resistance, nonlinear constant and varistor voltage.

TABLE 10

| Sample | Ratio (mol % in terms of metal element) | | | | | | Firing temperature | Note |
| --- | --- | --- | --- | --- | --- | --- | --- | --- |
| | ZnO | $Bi_2O_3$ | $Co_3O_4$ | $Mn_3O_4$ | $Cr_2O_3$ | Others | | |
| 6-1 | Bal. | 1.0 | 0.1 | 0.05 | 0.05 | 0.0 | 850 | Comparative Example |
| 6-2 | Bal. | 0.6 | 0.2 | 0.5 | 0.1 | 0.0 | 850 | Example |
| 6-3 | Bal. | 0.6 | 1.0 | 0.1 | 0.5 | 0.0 | 850 | Example |
| 6-4 | Bal. | 0.6 | 0.5 | 1.0 | 1.0 | 0.0 | 850 | Example |
| 6-5 | Bal. | 1.0 | 1.0 | 0.1 | 0.5 | 0.0 | 850 | Example |
| 6-6 | Bal. | 1.0 | 0.5 | 0.5 | 0.5 | 0.0 | 850 | Example |
| 6-7 | Bal. | 1.0 | 1.0 | 1.0 | 1.0 | 0.0 | 850 | Example |

TABLE 11

| Sample | Insulation resistance value | Nonlinear constant | Varistor voltage |
| --- | --- | --- | --- |
| 6-1 | $2 \times 10^8$ | 4 | 2000 |
| 6-2 | $6 \times 10^9$ | 10 | 2100 |
| 6-3 | $2 \times 10^{10}$ | 11 | 1900 |
| 6-4 | $7 \times 10^9$ | 13 | 1900 |
| 6-5 | $2 \times 10^8$ | 10 | 2000 |
| 6-6 | $8 \times 10^9$ | 12 | 2100 |
| 6-7 | $3 \times 10^9$ | 10 | 1900 |

(1) Multilayer Substrate 200

Original raw materials shown in Table 12 were measured to have the same composition as shown in the table, introduced together with ethanol and zirconia balls in a ball mill casing, and then mixed by the ball mill at 100 rpm for 20 hours.

All samples (mixed raw materials obtained after being dried) shown in Table 12 were subjected to the ICP (inductively coupled plasma) wet analysis. As a result, each of the contents of antimony (Sb), rare earth element and tin (Sn) was equal to or less than the detection limit (detection limit: 100 ppm by mass ratio). This means that each of the contents of antimony (Sb), rare earth element and tin (Sn) that was obtained by conversion from the mass ratio into molar ratio was less than 0.01 mol %.

The mixed-raw-material sheet 2 was fabricated using the same method as that in Example 1.

The insulating sheet 10 having a thickness of 0.08 mm fabricated by the same method as that in Example 5 was cut out in the size of approximately 20 mm×40 mm. A metal stick of 0.5 mm in diameter was pressed against the cut insulating sheet 10 to form the through hole 14.

A silver electrode paste was charged into the through hole 14 of the insulating sheet 10 and dried out to thereby form the electrode paste layer 6F, which served as the penetrating electrode 6F after the firing.

As shown in FIG. 3(c), the silver electrode paste was applied to the surface of the insulating sheet 10 by the screen printing, and dried at a temperature of 60° C. or higher to thereby form the electrode paste layer 6E with a diameter of 6 mm on the upper surface of the insulating sheet 10 to be in contact with the electrode paste layer 6F, thus producing a laminated body 150. Two laminated bodies 150 of each sample were fabricated. The thickness of the electrode paste layer 6E was adjusted in such a manner that the thickness of the electrode layer 6E after the sintering was 10 µm. Note that in sample 6-7, instead of the insulating sheet 10, GREEN TAPE 951PT manufactured by Du Pont Kabushiki Kaisha was used as the insulating sheet. The GREEN TAPE 951PT contained lead, aluminum, boron and ceramic material which were to be densified by being sintered at 900° C.

In one of the two laminated bodies 150, the mixed-raw-material sheet 2 punched into a diameter of 14 mm was used to completely cover the main surface of the electrode paste layer 6E. Thereafter, it was dried at a temperature of 60° C. or higher to thereby produce a laminated body 160.

The through hole 14A with a diameter of 14 mm was provided in another insulating sheet 10 (in sample 6-7, GREEN TAPE 951PT produced by Du Pont Kabushiki Kaisha).

As shown in FIG. 5, the laminated body 160 (with one of two main surfaces of the insulating sheet 10 on the mixed-raw-material sheet 2 side positioned as the lower surface), the insulating sheet 10 with the through hole 14A, and the laminated body 150 were disposed. The laminated bodies 150 and 160 and their respective insulating layers 10 were in contact with (laminated on) the insulating layer 10 with the through hole 14A in the following manner. Specifically, the center of the circle of the electrode paste layer 6E in the laminated body 150 was aligned with the center of the circle of the electrode paste layer 6E in the laminated body 160 with the positional accuracy of 0.5 mm. Further, the electrode paste layer 6E and mixed-raw-material sheet 2 in the laminated body 160 and the electrode paste layer 6E in the laminated body 150 were laminated in the through hole 14A. These layers were pressed at 85° C. to thereby produce a composite laminated body.

The thus-obtained composite laminated body was heated at a temperature increase rate of 200° C./hour and fired at 900° C. for two hours, thereby producing the multilayer substrate 200. The varistor characteristics of the varistor layer were measured on samples 6-8 to 6-14 of the obtained multilayer substrate 200 by the same method as that in Example 1. Note that the voltage (varistor voltage) applied during measuring the varistor characteristics was divided by the thickness of the varistor layer obtained after the sintering to define the thus-obtained standardized value as the varistor voltage. The current used was determined by dividing a measured current value (A) by an electrode area (cm$^2$).

In measuring the varistor characteristics, the conductive paste is applied to the part of the penetrating electrode 6F exposed from the upper surface of the insulating layer 10A as well as the part of the penetrating electrode 6F exposed from the lower surface of the insulating layer 10C, thereby forming the electrodes as measurement terminals. The measurement results are shown in Table 11.

As can be seen from Table 13, also in use of the raw material having the composition shown in Table 12, the samples of Examples in the present invention are superior in all the insulation resistance, nonlinear constant, and varistor voltage.

TABLE 12

| Sample | Ratio (mol % in terms of metal element) | | | | | Firing temperature | Note |
| | ZnO | Bi$_2$O$_3$ | Co$_3$O$_4$ | Mn$_3$O$_4$ | Cr$_2$O$_3$ | Others | | |
|---|---|---|---|---|---|---|---|---|
| 6-8 | Bal. | 0.6 | 0.5 | 1.0 | 1.0 | 0.0 | 850 | Example |
| 6-9 | Bal. | 2.0 | 0.2 | 1.0 | 0.5 | 0.0 | 850 | Example |
| 6-10 | Bal. | 1.0 | 1.0 | 1.0 | 1.0 | 0.0 | 850 | Example |
| 6-11 | Bal. | 1.0 | 0.5 | 0.5 | 0.5 | S$_2$O$_3$ = 2.0 | 850 | Example |
| 6-12 | Bal. | 1.0 | 0.5 | 0.5 | 0.5 | Sc$_2$O$_3$ = 0.5 | 850 | Example |
| 6-13 | Bal. | 1.0 | 2.5 | 2.5 | 2.5 | 0.0 | 850 | Comparative Example |
| 6-14 | Bal. | 1.0 | 0.5 | 0.5 | 0.5 | 0.0 | 850 | Example |

TABLE 13

| Sample | Insulation resistance value | Nonlinear constant | Varistor voltage |
|---|---|---|---|
| 6-8 | 3 × 10$^9$ | 11 | 2100 |
| 6-9 | 4 × 10$^8$ | 12 | 1600 |
| 6-10 | 3 × 10$^8$ | 10 | 2600 |
| 6-11 | 7 × 10$^9$ | 11 | 1900 |
| 6-12 | 1 × 10$^8$ | 10 | 2200 |
| 6-13 | 5 × 10$^9$ | 7 | 1600 |
| 6-14 | 9 × 10$^9$ | 11 | 590 |

This application claims priority based on Japanese Patent Application No. 2013-253230 filed on Dec. 6, 2013, and Japanese Patent Application No. 2014-082000 filed on Apr. 11, 2017 in Japan, the disclosure of which is incorporated by reference herein.

DESCRIPTION OF REFERENCE NUMERALS

2: Varistor layer (mixed-raw-material sheet or slurry layer before firing)
2A: First varistor layer (mixed-raw-material sheet or slurry layer before firing)
2B: Second varistor layer (mixed-raw-material sheet or slurry layer before firing)
6: Electrode
6A: First surface electrode
6B: Second surface electrode
6C: First electrode layer
6D: Second electrode layer 6E: Surface electrode
6F: Penetrating electrode
8: Resin sheet
10: Insulating layer
10A: First insulating layer
10B: Second insulating layer
100: Third insulating layer
12: Semiconductor chip
14: Through hole
16: Electrode
18: Wire
22: Varistor sheet laminated body (mixed-raw-material sheet laminated body before firing)
26: Penetrating electrode
36A: First internal electrode
36B: Second internal electrode
100, 300, 400, 500: Multilayer substrate
450, 460: Laminated body

The invention claimed is:

1. A sintered body for a varistor, comprising:
   zinc oxide as a main component;
   0.6 to 3.0 mol % of bismuth oxide in terms of bismuth (Bi);
   0.2 to 1.4 mol % of cobalt oxide in terms of cobalt (Co);
   0.1 to 1.5 mol % of chrome oxide in terms of chrome (Cr); and
   0.1 to 1.5 mol % of manganese oxide in terms of manganese (Mn), wherein
   the contents of antimony (Sb), a rare earth element and tin (Sn) are not more than a level of impurities.

2. The sintered body for a varistor according to claim 1, comprising:
   0.6 to 3.0 mol % of bismuth oxide in terms of bismuth (Bi);
   0.2 to 1.4 mol % of cobalt oxide in terms of cobalt (Co);
   0.1 to 1.5 mol % of chrome oxide in terms of chrome (Cr);
   0.1 to 1.5 mol % of manganese oxide in terms of manganese (Mn); and
   the balance being zinc oxide and inevitable impurities.

3. The sintered body for a varistor according to claim 2, further comprising at least one selected from the group consisting of 0.1 to 2.0 mol % of scandium oxide in terms of scandium (Sc); 0.1 to 2.0 mol % of barium oxide in terms of barium (Ba); and 0.1 to 4.0 mol % of boron oxide in terms of boron (B).

4. The sintered body for a varistor according to claim 3, further comprising at least one selected from the group consisting of 0.1 to 2.0 mol % of scandium oxide in terms of scandium (Sc); 0.1 to 2.0 mol % of barium oxide in terms of barium (Ba); and 0.1 to 2.0 mol % of boron oxide in terms of boron (B).

5. The sintered body for a varistor according to claim 1, further comprising at least one selected from the group consisting of 0.1 to 2.0 mol % of scandium oxide in terms of scandium (Sc); 0.1 to 2.0 mol % of barium oxide in terms of barium (Ba); and 0.1 to 4.0 mol % of boron oxide in terms of boron (B).

6. The sintered body for a varistor according to claim 5, further comprising at least one selected from the group consisting of 0.1 to 2.0 mol % of scandium oxide in terms of scandium (Sc); 0.1 to 2.0 mol % of barium oxide in terms of barium (Ba); and 0.1 to 2.0 mol % of boron oxide in terms of boron (B).

7. The sintered body for a varistor according to claim 1, further comprising:
   0.6 to 2.0 mol % of bismuth oxide in terms of bismuth (Bi);
   0.2 to 1.0 mol % of cobalt oxide in terms of cobalt (Co);
   0.1 to 1.0 mol % of chrome oxide in terms of chrome (Cr); and
   0.1 to 1.0 mol % of manganese oxide in terms of manganese (Mn).

8. A multilayer substrate comprising:
   a first insulating layer;
   a varistor layer as the sintered body for a varistor according to claim 1; and
   a second insulating layer in this order,
   the multilayer substrate further comprising:
   a first internal electrode disposed at one main surface of the varistor layer;
   a second internal electrode disposed at the other main surface of the varistor layer; and
   a first penetrating electrode penetrating the first insulating layer and a second penetrating electrode penetrating the second insulating layer, wherein
   the first penetrating electrode is electrically connected to the first internal electrode, and the second penetrating electrode is electrically connected to the second internal electrode.

9. A multilayer substrate comprising:
   a first insulating layer, a second insulating layer, and a third insulating layer, which are laminated in this order, the second insulating layer including therein a varistor layer as the sintered body for a varistor according to claim 1;
   a first internal electrode disposed at one main surface of the varistor layer;
   a second internal electrode disposed at the other main surface of the varistor layer;
   a first penetrating electrode penetrating the first insulating layer; and
   a second penetrating electrode penetrating the second insulating layer, wherein
   the first penetrating electrode is electrically connected to the first internal electrode, and the second penetrating electrode is electrically connected to the second internal electrode.

10. A multilayer substrate comprising:
    a first insulating layer; a varistor layer as the sintered body for a varistor according to claim 1; and a second insulating layer in this order,
    the multilayer substrate further comprising:
    a first internal electrode disposed at one main surface of the varistor layer;
    a second internal electrode disposed at the other main surface of the varistor layer; and
    first and second penetrating electrodes penetrating the first insulating layer, the varistor layer and the second insulating layer, wherein
    the first penetrating electrode is electrically connected to the first internal electrode, and the second penetrating electrode is electrically connected to the second internal electrode.

11. A method for producing a sintered body for a varistor, which comprises the steps of:
    1) preparing a mixed raw material by mixing at least zinc oxide, bismuth oxide, cobalt oxide, chrome oxide and manganese oxide without applying a heat treatment such that the mixed raw material contains the zinc oxide as a main component, 0.6 to 3.0 mol % of bismuth oxide in terms of bismuth (Bi), 0.2 to 1.4 mol % of cobalt oxide in terms of cobalt (Co), 0.1 to 1.5 mol % of chrome oxide in terms of chrome (Cr) and 0.1 to 1.5 mol % of manganese oxide in terms of manganese (Mn), wherein the contents of antimony (Sb), rare earth element and tin (Sn) are not more than a level of impurities; and 2) firing the mixed raw material at a temperature of 850° C. to 950° C.

12. The method for producing a sintered body for a varistor according claim 11, wherein the mixed raw material further comprises at least one selected from the group consisting of 0.1 to 2.0 mol % of scandium oxide in terms of scandium (Sc); 0.1 to 2.0 mol % of barium oxide in terms of barium (Ba); and 0.1 to 4.0 mol % of boron oxide in terms of boron (B).

13. A method for producing a multilayer substrate, which comprises the steps of:
1) preparing a mixed raw material by mixing at least zinc oxide, bismuth oxide, cobalt oxide, chrome oxide and manganese oxide without applying a heat treatment such that the mixed raw material contains the zinc oxide as a main component, 0.6 to 3.0 mol % of bismuth oxide in terms of bismuth (Bi), 0.2 to 1.4 mol % of cobalt oxide in terms of cobalt (Co), 0.1 to 1.5 mol % of chrome oxide in terms of chrome (Cr) and 0.1 to 1.5 mol % of manganese oxide in terms of manganese (Mn), wherein the contents of antimony (Sb), rare earth element and tin (Sn) are not more than a level of impurities;
2) disposing a first electrode material on a first insulating sheet made of insulating material;
3) forming a mixed-raw-material sheet containing the mixed raw material on the first electrode material;
4) disposing a second electrode material on the mixed-raw-material sheet;
5) forming a second insulating sheet made of insulating material on the second electrode material;
6) forming a first penetrating electrode electrically connected to the first electrode material while penetrating the first insulating sheet, the mixed-raw-material sheet and the second insulating sheet;
7) forming a second penetrating electrode electrically connected to the second electrode material while penetrating the first insulating sheet, the mixed-raw-material sheet and the second insulating sheet; and
8) firing the first insulating sheet, the mixed-raw-material sheet and the second insulating sheet at a temperature of 850° C. to 950° C.

* * * * *